(12) United States Patent
Sadeghi et al.

(10) Patent No.: US 12,217,945 B2
(45) Date of Patent: Feb. 4, 2025

(54) SORPTION CHAMBER WALLS FOR SEMICONDUCTOR EQUIPMENT

(71) Applicant: Lam Research Corporation, Fremont, CA (US)

(72) Inventors: Hossein Sadeghi, San Jose, CA (US); Richard A. Gottscho, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 445 days.

(21) Appl. No.: 17/639,324

(22) PCT Filed: Aug. 6, 2020

(86) PCT No.: PCT/US2020/045282
§ 371 (c)(1),
(2) Date: Feb. 28, 2022

(87) PCT Pub. No.: WO2021/045867
PCT Pub. Date: Mar. 11, 2021

(65) Prior Publication Data
US 2022/0319821 A1    Oct. 6, 2022

Related U.S. Application Data

(60) Provisional application No. 62/897,076, filed on Sep. 6, 2019.

(51) Int. Cl.
*B01D 53/04* (2006.01)
*H01J 37/32* (2006.01)

(52) U.S. Cl.
CPC ........ *H01J 37/32862* (2013.01); *B01D 53/04* (2013.01); *B01D 53/0407* (2013.01);
(Continued)

(58) Field of Classification Search
CPC ............. B01D 53/04; B01D 53/0446; B01D 53/0407; B01D 53/0438; B01D 2256/10;
(Continued)

(56) References Cited

U.S. PATENT DOCUMENTS 9,234,278 B2    1/2016  Chou et al.
2005/0092176 A1*  5/2005  Ding ........................ B01J 20/20
                                                            96/108
(Continued)

FOREIGN PATENT DOCUMENTS

KR   10-2007-0070866 A    7/2007
WO   WO-2006132156 A1 * 12/2006  ............. G01N 30/06

OTHER PUBLICATIONS

ISR & Written Opinion PCT/US2020/045282, dated Nov. 17, 2020, 7 pages.

*Primary Examiner* — Frank M Lawrence, Jr.
(74) *Attorney, Agent, or Firm* — PENILLA IP, APC

(57) ABSTRACT

A sorption structure used in a plasma process chamber includes an inner layer having one or more heating elements to heat the sorption structure, a middle section having a lattice structure and a coolant flow delivery network through which a coolant circulates to cool the sorption structure, and a vacuum flow network that is connected to a vacuum line to create low pressure vacuum. The lattice structure includes network of openings defined in a plurality of layers. The inner layer is disposed adjacent to the middle section and an outer layer of the lattice structure faces an interior region of the chamber. The openings in the layers of the lattice structure progressively increase in size from the inner layer to the outer layer. The lattice structure is used to adsorb by-products released in the process chamber and the vacuum flow network is used to remove the by-products.

27 Claims, 10 Drawing Sheets

(52) U.S. Cl.
CPC ..... *B01D 53/0438* (2013.01); *B01D 53/0446* (2013.01); *H01J 37/32522* (2013.01); *H01J 37/32568* (2013.01); *H01J 37/32816* (2013.01); *B01D 2256/10* (2013.01); *B01D 2259/40096* (2013.01); *H01J 2237/002* (2013.01); *H01J 2237/24585* (2013.01); *H01J 2237/334* (2013.01)

(58) Field of Classification Search
CPC ...... B01D 2259/40096; H01J 37/32862; H01J 37/32522; H01J 37/32568; H01J 37/32816; H01J 37/32871; H01J 37/32477; H01J 2237/002; H01J 2237/24585; H01J 2237/334
USPC ......... 96/109, 113, 126, 127, 130, 144, 146, 96/154; 95/21, 96, 106, 114, 115, 141
See application file for complete search history.

(56) References Cited

U.S. PATENT DOCUMENTS

| | | | |
|---|---|---|---|
| 2007/0175329 A1* | 8/2007 | Inoue | B01J 39/18 96/108 |
| 2008/0299493 A1 | 12/2008 | Oki | |
| 2013/0092185 A1 | 4/2013 | Matsui et al. | |
| 2016/0293380 A1 | 10/2016 | Martin et al. | |

* cited by examiner

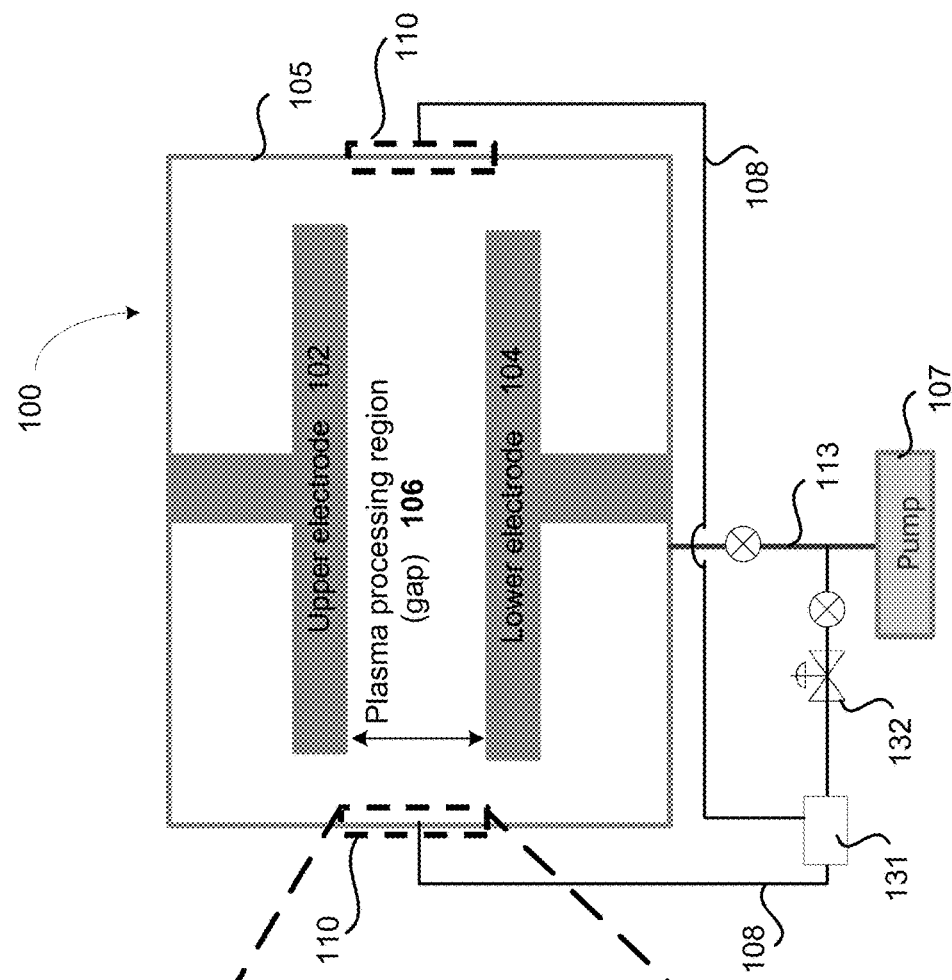
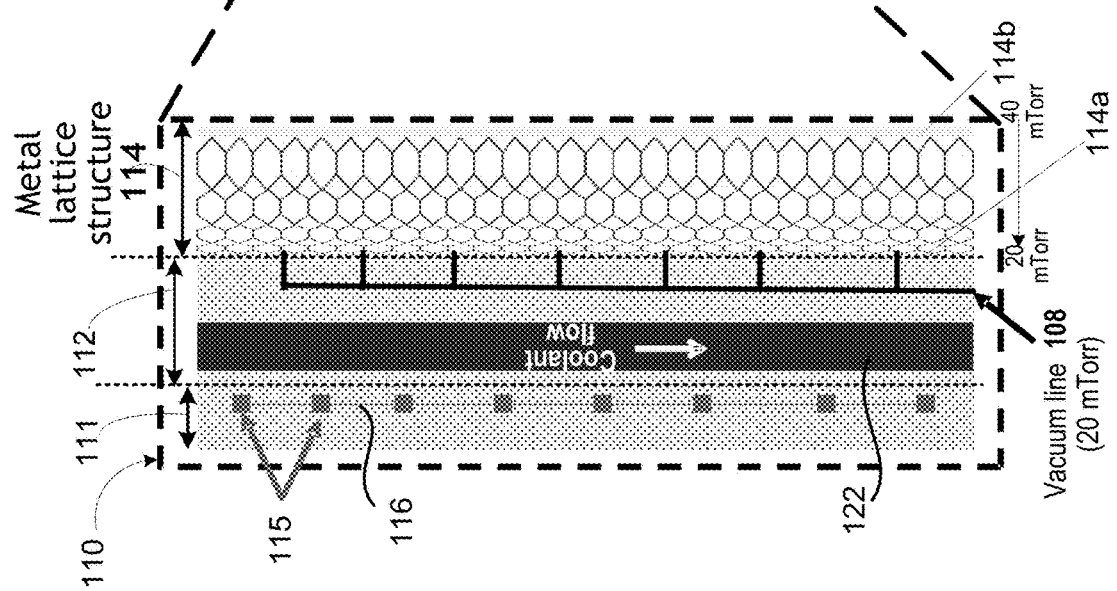
Figure 1
Figure 1A

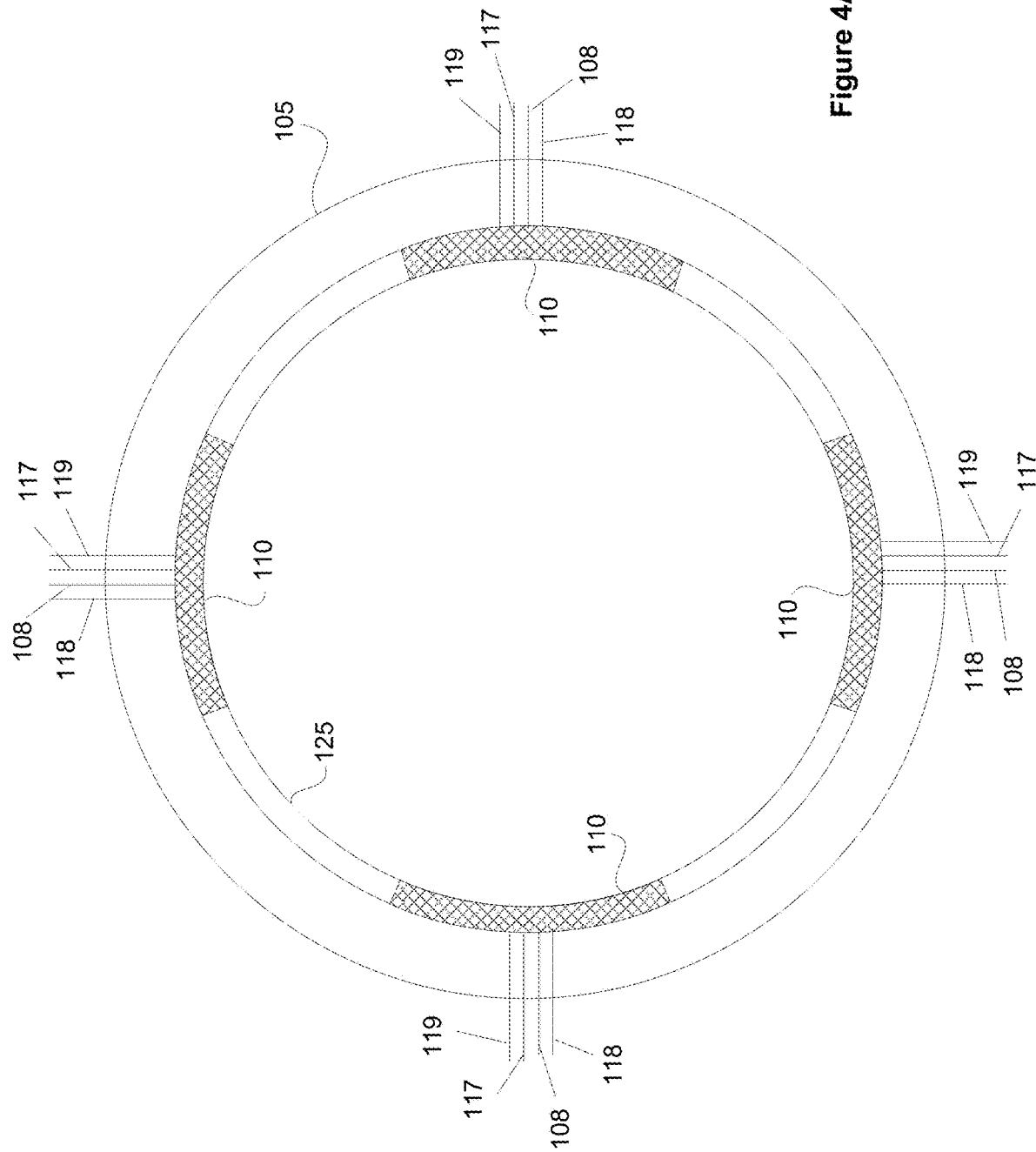

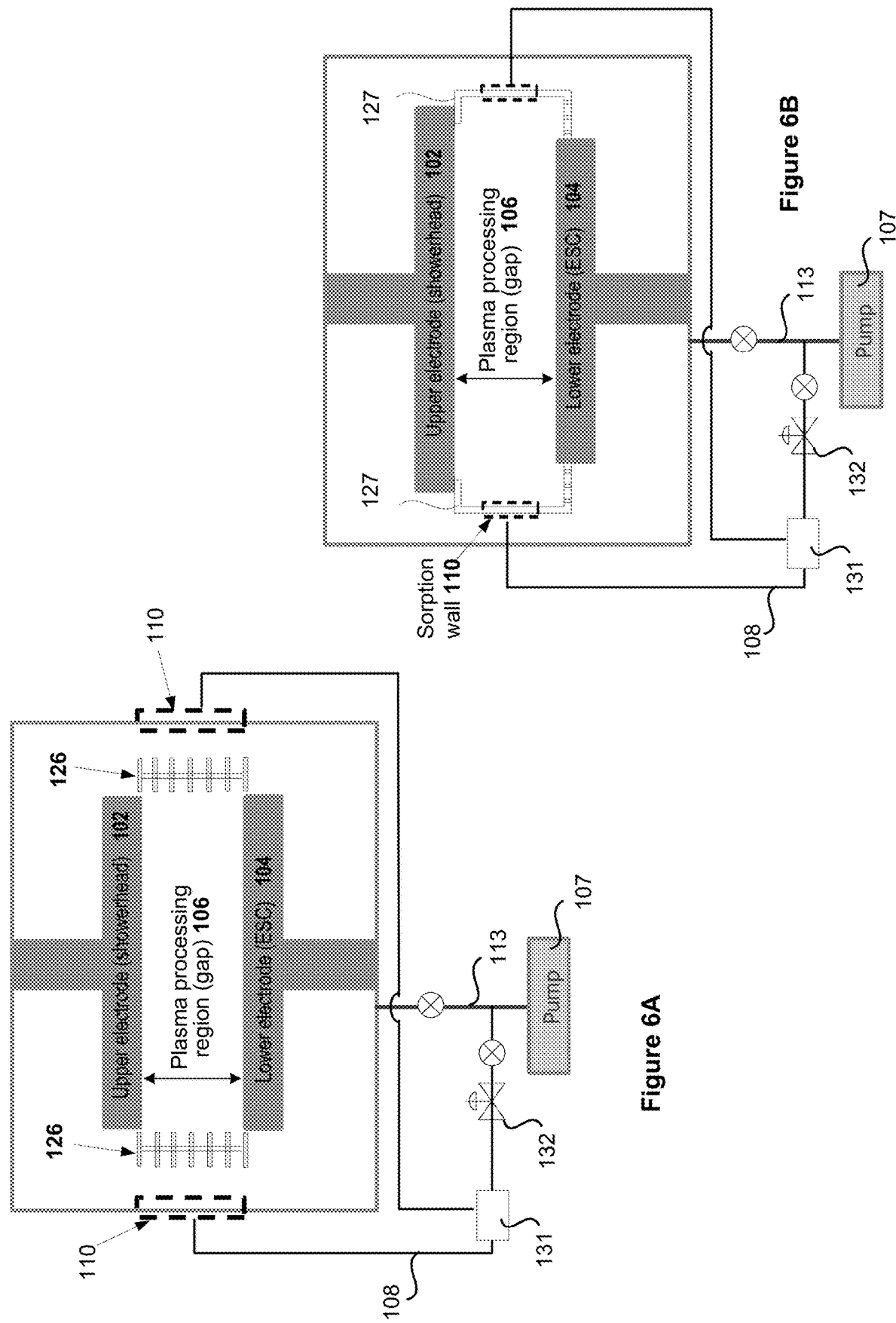

SORPTION CHAMBER WALLS FOR SEMICONDUCTOR EQUIPMENT

CLAIM OF PRIORITY

This application is a national stage filing of and claims priority, under 35 U.S.C. § 371, to PCT/US20/45282, filed on Aug. 6, 2020, and titled "SORPTION CHAMBER WALLS FOR SEMICONDUCTOR EQUIPMENT", which claims the benefit of and priority, under 35 U.S.C. § 119 (e), to Provisional Patent Application No. 62/897,076, filed on Sep. 6, 2019, and titled "SORPTION CHAMBER WALLS FOR SEMICONDUCTOR EQUIPMENT", both of which are incorporated by reference herein in their entirety.

TECHNICAL FIELD

The present embodiments relate to semiconductor substrate processing equipment tools, and more particularly to an equipment tool with a sorption chamber wall for controlling adsorption and desorption of particles and other by-products released during processing of a substrate.

BACKGROUND OF THE DISCLOSURE

In semiconductor processing systems, such as plasma chambers, reactant gases are used to generate plasma to etch various microscopic features on a surface of a substrate. These reactant gases generate by-products particulates, such as polymers. These by-products adhere to exposed surfaces, such as chamber walls or inner walls of liners. These by-products have to be removed periodically in order to prevent the accumulated by-products from contaminating the surface of the substrate and adversely affecting the process results.

One way of cleaning the walls of the chamber is by opening the chamber and manually cleaning the walls. The manual clean may vary from one chamber (i.e., process module (PM)) to the next, leading to a PM-to-PM mismatch. Further, if the manual cleaning is not done carefully, there is a potential of damaging one or more components of the chamber. In addition to PM-to-PM mismatch, throughput may get affected due to the amount of time it takes to bring the chamber back up for processing a substrate, after every clean.

Other automated procedures such as Waferless AutoClean (WAC) and Cover Wafer Area Clean (CWAC) run various process recipes (gas type, gas flow, temperature, pressure, duration, etc.) to achieve consistent and repeatable chamber cleaning which remove the need for opening the chamber to perform cleaning. However, in some applications WAC/CWAC process is long and may need to be performed frequently (e.g., every time after a wafer is processed), which could lead to considerable reduction in throughput. In addition, WAC and CWAC processes use harsh plasma chemistry to remove residues on chamber walls and these harsh environments can also erode chamber components, such as chamber walls, electrodes, and edge rings.

Once the chamber walls have been cleaned, processing of the substrates resume. The accumulation of process by-products on the chamber surfaces during processing of the substrates changes the reflectance of these surfaces for incoming particles, which result in a change in the plasma field over time and may lead to process drift. This may be due to the gradual building up of the by-products on the various surfaces within the chamber (either on the chamber wall or on the inner liner or upper electrode surface or on any other surface that is exposed to plasma) and the substrates that are processed within the chamber being exposed to varying degrees of by-product buildup within the chamber. For instance, the first substrate processed immediately after a chamber clean is exposed to a clean chamber wall and each subsequent substrate that is processed in the chamber is exposed to different degrees of cleanliness within the chamber as the by-product buildup on the chamber wall increases over time. This can lead to substrate-to-substrate (or wafer-to-wafer) process drift. Additional substrate-to-substrate drift may occur when a substrate is subjected to different etch rate over time. Similar issues may arise when the substrate is exposed to other processes, such as deposition, etc.

For some applications with long process time, the accumulation of process by-products deposited on the chamber surfaces could reach a point, wherein the thickness of deposited film on the chamber surfaces reaches a critical value at which time the film starts to crack and eject particles into the chamber causing defects on the wafer. To help delay by-product film from cracking and to create a more uniform environment from substrate to substrate, a pre-coating material is often deposited on the chamber walls before the process starts. However, for processes with very long durations pre-coating technique may not be sufficient.

It is in this context that embodiments of the disclosure arise.

SUMMARY

The present embodiments relate to providing a sorption wall with a large surface area that can adsorb a large amount of the by-products released within the chamber during substrate processing. The by-product contaminants adsorbed on the sorption wall are cleaned without needing to open the chamber. Due to large surface area of the sorption wall the time duration that the chamber can process wafers without the need for cleaning is increased. The sorption walls described in the various embodiments provide a way to perform both an adsorption step and a desorption step. In the adsorption step, the temperature of the sorption wall is maintained at a level that is sufficient to selectively adsorb particles, particularly the etch by-product particles generated during the substrate processing and condense them, while at the same time prevent condensation of the reactant gas(es) used for processing the substrate in the chamber. In the desorption step, the sorption wall is heated to a temperature that is sufficient to release the deposited etch by-products from the sorption walls and Waferless AutoClean (WAC) and Cover Wafer Area Clean (CWAC) is performed with or without a Gas Purge AutoClean (GPAC). Since the sorption wall assists in adsorbing the by-products and no incoming by-product particles are reflected back from the chamber surfaces, the sorption wall is also referred to herein as a "non-reflective" chamber wall.

A lattice structure in the form of, for example, a metal foam, is defined in the sorption structure to successfully adsorb the by-products released during substrate processing. The lattice structure provides an increased surface area so that greater amount of the by-products can be adsorbed before the chamber needs to be cleaned, leading to a reduction in frequency at which WAC/CWAC need to be performed. The lattice structure includes layers of openings of varying sizes to assist in successfully adsorbing the by-products. The temperature of the sorption structure is maintained at a temperature sufficient to condense the by-products released during substrate processing, by flowing coolant through internal channels defined in the sorption structure. After the processing some number of substrates, the surface temperature of the lattice structure is increased either through heat flowing through the internal channels or by any other means, so that the by-products are desorbed from the lattice structure during WAC/CWAC and are removed through a purge using a pump. The number of substrates to be processed before the desorption step is initiated, is specific to the process and is chosen to optimize throughput while minimizing defects and variability. As the by-products are removed via the sorption structure of the chamber during the process, the overall quality of the substrate processed within the chamber substantially improves as process drift caused by time-varying chamber wall reflectance is minimized Additionally, as the cleaning is performed without having to open the chamber, or having to perform the WAC/CWAC after every substrate, there is a significant improvement in the output of the substrates processed within the chamber, as there is minimum delay in conditioning the chamber for substrate processing. In addition, due to increased effective wall surface area where process by-products can be deposited on, the by-product film thickness reaching the critical value where the film cracking occurs is delayed, thereby reducing on-wafer defects. Further, since the cleaning is not performed manually but performed automatically using the sorption structure, process chamber to process chamber mismatch and substrate-to-substrate drift are minimized. Also, by effectively increasing the adsorption rate of the process by-products on the sorption wall, the availability of the by-products within the chamber is reduced, thereby reducing the rate at which by-products get deposited on other chamber surfaces. This in-directly provides a positive side-effect by assisting to reduce the frequency at which other chamber surfaces need to be cleaned as well. Several inventive embodiments of the present disclosure are described below.

The sorption structure defined in a portion of a chamber includes an inner section, a middle section and a lattice structure. The inner section includes one or more heating elements. The heating elements are connected to a heat source via a heating cable. The middle section includes a coolant delivery network to allow a coolant from a coolant source to flow through one or more channels defined therein. The middle section also includes vacuum conduits that are connected to a vacuum line. The middle section is disposed immediately adjacent to the inner section. The lattice structure is defined adjacent to the middle section, such that an outer layer of the lattice structure faces an interior region of the chamber. The lattice structure has a network of openings and is connected to the vacuum conduits in the middle section. The vacuum line is used to remove the by-products adsorbed in the lattice structure.

In another embodiment, a method for adsorbing and removing by-products generated in a chamber that includes a sorption structure defined in a portion of the chamber, is described. The method includes cooling the sorption structure to a first temperature by flowing coolant in one or more channels defined within a middle section of the sorption structure. The coolant is circulated from a coolant source through a coolant inlet, through the one or more channels and out through a coolant outlet. Using coolant flow to cool the sorption structure is one example and other methods of cooling the sorption structure may also be employed, including thermoelectric cooling, so long as the other methods have sufficient capacity to condense and maintain the temperature at a desired level. The first temperature can be defined to be sufficient to increase adsorption of the by-products released in the chamber but not condense a reactant gas used in the chamber. The method further includes capturing the by-products released within the chamber during processing of a substrate, using a lattice structure, or more generally an architected structure, defined in the sorption structure. The lattice structure includes a network of openings and the by-products are captured at an outer layer of the lattice structure facing an interior region of the chamber and pushed toward an inner layer that is adjacent to the middle section. The sorption structure is heated to a second temperature so as to release the by-products from the network of openings of the lattice structure during desorption chamber cleaning. The lattice structure is heated using one or more heating elements defined in an inner section, wherein the inner section is disposed adjacent to the middle section, which is adjacent to the lattice structure. The captured by-products released from the lattice structure are removed via WAC/CWAC procedure in conjunction with GPAC or without GPAC, and through a vacuum line coupled to the lattice, wherein the vacuum line is operated using a pump.

Other aspects of the invention will become apparent from the following detailed description, taken in conjunction with the accompanying drawings, illustrating by way of example the principles of the invention.

BRIEF DESCRIPTION OF THE DRAWINGS

The embodiments may best be understood by reference to the following description taken in conjunction with the accompanying drawings.

FIG. 1 illustrates a simplified view of an example etch chamber with a sorption structure defined on a portion of a wall of the etch chamber, in accordance with one implementation of the present disclosure. FIG. 1A illustrates an expanded view of the sorption structure, in accordance with one implementation of the present disclosure.

FIG. 4A illustrates a simplified overhead view of an etch chamber identifying some chamber parts and one example configuration of the sorption structure, in accordance with one implementation of the present disclosure.

FIG. 6A illustrates a simplified view of a first alternate example of an etch chamber in which sorption structure is disposed to cover a portion of a wall of the chamber, in accordance with one implementation of the present disclosure.

FIG. 6B illustrates a simplified view of a second alternate example of an etch chamber in which sorption structure is disposed on a portion of a C-shroud defined within the chamber, in accordance with one implementation of the present disclosure.

DETAILED DESCRIPTION

Figure 2:
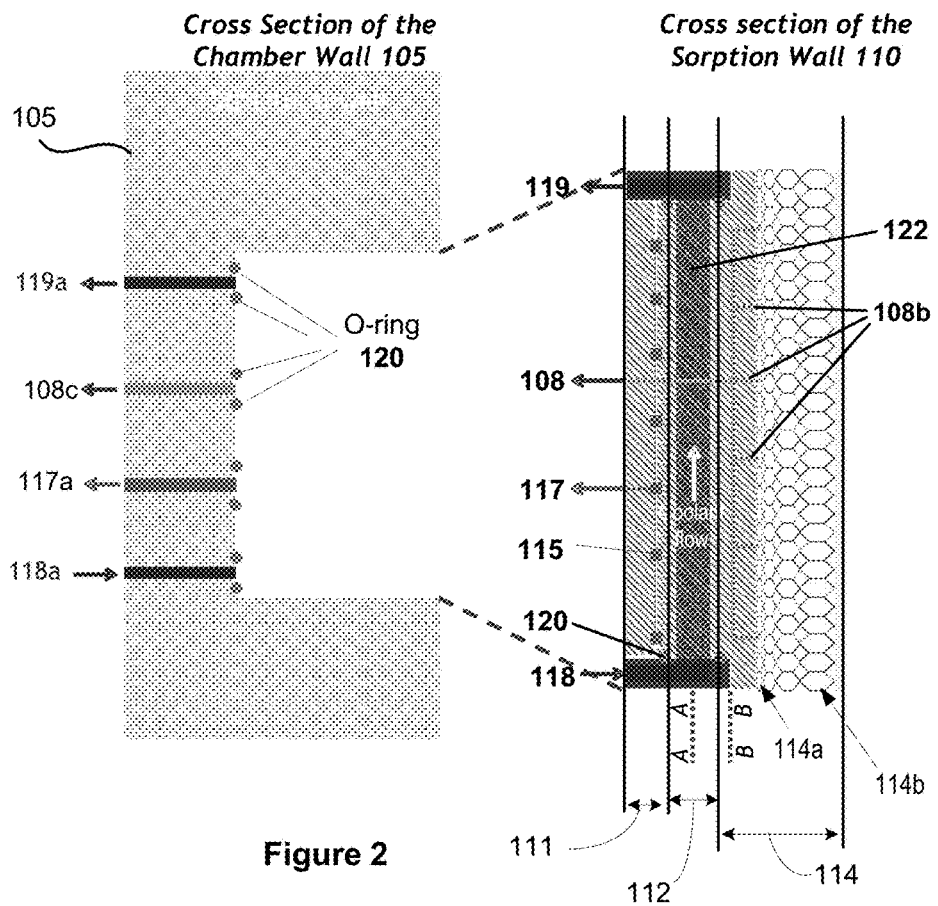
FIG. 2 illustrates expanded view of the sorption structure identifying different components, in accordance with one implementation of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various implementation of the present disclosure describe systems and methods for providing a sorption structure that can be integrated into an interior region of a chamber used in processing a substrate, to remove particulates and other by-products generated in the chamber during processing of the substrate. The portion of a wall where a sorption structure is integrated may be a portion of a chamber wall, or a portion of a liner defined within the chamber, or a portion of a plasma confinement structure defined within the chamber, wherein the portion aligns with a gap defined between an upper electrode (e.g., a showerhead, etc.) and a lower electrode (e.g., electrostatic chuck (ESC), a pedestal, etc.). The sorption structure includes a lattice structure, which may be made of architected material, such as metal foam or honeycomb, a coolant flow network, one or more heating elements, one or more vacuum conduits coupled to a vacuum line to efficiently attract and remove the by-products generated within the chamber. The lattice structure provides a large surface area for adsorbing the by-products efficiently. The coolant source provides the coolant that can be circulated through the channels so as to maintain the sorption structure at a temperature that is appropriate for consistent adsorption of the by-products during the process. In order to maintain a consistent adsorption rate on the lattice structure, the wall temperature during the process maybe time-dependent to account for added thermal resistance of previously deposited film on the lattice surfaces. The heat source is used to provide heat to the lattice structure so that the by-products adsorbed on the lattice structure are released quickly during WAC/CWAC. The vacuum line is connected between the sorption structure and a pump (e.g., vacuum turbo pump) to provide the vacuum locally on the sorption wall for removing the released by-products. The efficient adsorption and removal (desorption) of the by-products using the sorption structure ensures that the by-products released in the chamber do not reflect back from the surface that they have adhered to and contaminate the substrate surface, thereby preserving quality of the substrate.

In a conventional chamber design without the sorption structure, the by-products diffuse and accumulate on the walls of the chamber. During processing of the substrates, some of the by-products, such as polymers, accumulate on the chamber wall. When the accumulation of the by-products reaches a critical film thickness, the film can crack and release particles of varying sizes into the chamber, which can adhere to surface of the substrates, thereby creating defects on the substrate (i.e., wafer). The diffusion and accumulation of the by-products on the walls are slow, leading to process drift. In order to prevent the process drift, improve the processing quality of the substrates in the chamber, and decrease on-wafer defects, the conventional method required the chamber to be powered down, opened up, the walls manually scrubbed, closed up, conditioned, and powered back again. This process of cleaning the chamber takes time and leads to chamber-to-chamber drift based on the level of cleaning accomplished in each chamber. Additional process drift can occur when the etch rate varies from substrate to substrate, which can depend on the type of feature that is being formed.

To reduce the down-time, process chamber to process chamber mismatch, and to increase the substrate process throughput in the chamber, other automated procedures such as Waferless AutoClean (WAC) and Cover Wafer Area Clean (CWAC) were utilized. The WAC/CWAC run various process recipes (gas type, gas flow, temperature, pressure, duration, etc.) to achieve consistent and repeatable chamber cleaning and such cleaning is done without requiring the need for opening the chamber. WAC is performed without any wafers (i.e., substrates), while CWAC uses a dummy wafer placed on the ESC to protect ESC from corrosion caused by plasma during CWAC. Usually, during WAC, when ESC is being used as the lower electrode, the power to the ESC is turned off so as to prevent damage to the ESC and the process recipe for cleaning is run. The process recipe used in the WAC has to be effective in order to delay opening the chamber for thorough cleaning. The plasma chemistry used to remove residues on chamber walls can also erode chamber components, such as chamber walls, electrodes, edge rings, TCP window surfaces, etc.

The sorption structure described in the various implementations herein assist in reducing on-wafer defects, decreasing the frequency at which WAC/CWAC need to be performed, minimizing the process substrate-to-substrate drifts, keeping the condition of the chamber wall consistent, and maximizing by-product removal. As the cleaning process is performed without having to open the chamber to atmospheric conditions, there is an increase in the throughput and reduction in the chamber-to-chamber mismatch.

The sorption structure described in the various implementations act as a particle (i.e., by-products) "black hole" by engaging a pump to define a local low pressure region at the sorption structure. During the processing of the substrate, the sorption structure is used to perform an adsorption step, wherein the sorption structure is maintained at a temperature that is cold enough to reliably and consistently adsorb gases in a selective manner in the chamber, e.g., adsorb process by-products but not condense the reactant gas(es) used in the chamber. In some implementations, the sorption wall temperature could be time-dependent and set to selectively condense various gases on the sorption wall to achieve optimal process results.

In one implementation, the lower electrode in the chamber could be an electrostatic chuck (ESC) that provides a support surface for a substrate received for processing. The ESC operates by providing an electrostatic clamping force to the substrate when an electrostatic clamping voltage is applied to a clamping electrode included in the ESC. The clamping force and hence the clamping voltage are process dependent parameters and are defined during process recipe setup. Chamber pressure for the plasma used for processing the substrate is also a process dependent parameter and is defined during process recipe setup. Similar to ESC temperature and chamber pressure which are process dependent parameters and are defined during recipe set up, sorption wall temperature is process dependent and can be defined as a recipe parameter during recipe set up. By controlling the sorption wall temperature during recipe setup, more control can be achieved over the chamber conditions for optimal process results. The vacuum line network of the sorption structure together with the low temperature in the sorption structure provides a local, low pressure region, which assists in selective adsorption of the by-product particles to the sorption wall. A chemical coating on the lattice structure of the sorption structure aids in selective adsorption of the gases and the by-product species.

After substrate processing, when the sorption structure needs to be cleaned from the build-up of the by-products, a desorption step is carried out. In the desorption step, the sorption structure may be heated to a desired temperature that allows more-effective release of the by-products from the lattice structure. Embedded heating elements in the sorption structure are used in heating the sorption structure. Additionally, the local low pressure applied to the chamber is turned off and a WAC/CWAC (i.e., auto-cleaning) is carried out. In the desorption step, the by-products released from the lattice structure are removed via the vacuum line, using the turbo pump. In one implementation, the by-products released from the lattice structure may be removed using a regular pump foreline defined in the chamber. The desorption step sufficiently cleans the sorption structure so that the chamber with the cleaned sorption structure is ready for additional substrate processing.

To efficiently remove the by-products from the chamber, the sorption wall uses a large surface area, a low surface temperature during the adsorption step to effectively adsorb the by-products, and a high surface temperature during the desorption step to release the by-products adsorbed at the sorption structure. The lattice structure included in the sorption structure design provides the large surface area to efficiently adsorb the by-products while minimizing accumulation of the by-products in a single location. The lattice structure includes a network of openings with optimized topology, which allows for increased effective thermal conductivity of the lattice structure for efficient cooling/heating of the lattice structure via the internal cooling/heating system. Channels defined inside the sorption structure allow flow of coolant during the adsorption step when the sorption structure is to be maintained at a low temperature, and flow of heat during the desorption step when the sorption structure has to be heated to release the by-products from the lattice structure.

Embodiments of the present disclosure provide a sorption structure that is defined in a portion of a semiconductor processing tool (e.g., plasma process chamber) for removing by-products released in the processing tool during processing of a substrate. In some cases, the sorption structure may be defined on a portion of a chamber wall of the plasma process chamber, or on a portion of an inner liner that lines the chamber wall of the process chamber, or on a portion of a plasma confinement structure defined in the process chamber, etc. Irrespective of which surface of the chamber the sorption structure is defined on, the sorption structure is defined to align with a gap defined between an upper electrode (e.g., showerhead) and a lower electrode (e.g., electro static chuck, pedestal, etc.) disposed in the chamber. It can be appreciated that a similar sorption technique can be applied to any other chamber surfaces with high chance of process by-products accumulation (e.g. a TCP window disposed within the chamber, upper electrode, etc.).

Transformer coupled plasma (TCP) window is usually provided in a chamber to provide a vacuum seal. The presence of an electrically conductive by-product film on the surface of the TCP window may reduce the efficiency of the electromagnetic current in the chamber, thereby compromising or adversely affecting the etching process. To avoid adversely affecting the etching process, the surfaces of the chamber (including the surface of the TCP window) may have to be cleaned frequently to remove the deposited film of by-product. The frequency of clean can add to considerable down-time of the chamber. In addition to considerable chamber down-time, the frequent cleaning may erode the TCP window, reducing the life of the TCP window. Thus, by using the sorption wall, the availability of the by-products for deposition on the various surfaces within the chamber, including the TCP window surface, is reduced. This indirectly provides a positive side-effect by assisting to reduce the frequency at which chamber surfaces need to be cleaned as well.

Embodiments of the present disclosure relate to processing tool used in the processing of a substrate using operations, such as etching, deposition, plating, polishing, cleaning, spinning, etc., and generate by-products that need to be removed. Some example processing tool in which the sorption structure can be implemented include plasma etch chamber, a spin-rinse chamber, a metal plating chamber, a clean chamber, a bevel edge etch chamber, a deposition chamber (e.g., a physical vapor deposition (PVD) chamber, a chemical vapor deposition (CVD) chamber, an atomic layer deposition (ALD) chamber, a plasma enhanced chemical vapor deposition (PECVD) chamber, etc.) an atomic layer etch (ALE) chamber, an ion implantation chamber, or any other semiconductor processing tool that may be associated or used in the fabrication and/or manufacturing of semiconductor substrates that result in the release of by-products. Further, embodiments of the present disclosure are not limited to the examples provided herein, and may be practiced in different plasma processing systems employing different configurations, geometries, and plasma-generating technologies (e.g., inductively coupled systems, capacitively coupled systems, electron-cyclotron resonance systems, microwave systems, etc.).

With the above general understanding of the disclosure, details of various implementations will now be described with reference to the various drawings. It should be noted that similarly numbered elements and/or components in one or more figures are intended to generally have the same configuration and/or functionality. It should also be noted that figures may not be drawn to scale and, in some instances, certain features or components may be exaggerated to illustrate and/or emphasize novel concepts. It will be apparent, that the present embodiments may be practiced without some or all of these specific details. In other instances, well-known process operations have not been described in detail in order not to unnecessarily obscure the present embodiments.

FIG. 1 illustrates a simplified block diagram of a processing tool 100 (e.g., plasma etch chamber or module) used to receive a substrate and etch features on a surface of the substrate, in accordance with one implementation of the present disclosure. The plasma etch chamber (also referred to herein as a "chamber") 100 includes a top electrode 102 and a bottom electrode 104. The top electrode 102 is configured to be connected to one or more reactant gas sources (not shown) for providing reactant gas(es) to the chamber 100, and to a power source, (e.g., a radio frequency (RF) power source (not shown) through a match network (not shown)), to provide the power to generate plasma within the chamber 100. The top electrode 102 may be a showerhead having a plurality of outlets defined on a bottom surface that is facing a top surface of the lower electrode 104, to provide the reactant gas(es) to a plasma processing region 106 defined in the chamber 100. The lower electrode 104 may be an electrostatic chuck or a pedestal that provides a support surface to receive and support a semiconductor substrate (or simply referred to herein as a substrate or alternately as a wafer) during processing. The lower electrode may be grounded. In an alternate implementation, the upper electrode 102 may be grounded and the lower electrode 104 may be powered through RF power source or any other power source. The plasma etch chamber 100 is connected to a pump 107 that is used to remove the reactant gas(es) from the chamber 100.

A gap is formed between the upper electrode 102 and the lower electrode 104 to allow plasma to be formed from the reactant gas(es) supplied to the chamber 100. The gap defines the plasma processing region 106 that covers an area with upper and lower boundaries defined by the upper and the lower electrodes 102, 104, and the side boundaries defined on a side defined between outer edges of the upper electrode 102 and the lower electrode 104. The plasma formed from the reactant gas(es) is used to etch features on a top surface of the substrate received on the lower electrode 104. By-products, such as polymers and other particulates, released during the etch operation may adhere to portions of chamber wall 105 that align with the gap 106, or other surfaces.

In order to better control adsorption and desorption of particles and other by-products released during processing of a substrate, a sorption structure 110 is defined in the portion of the wall 105 of the chamber 100 that aligns with the plasma processing region (i.e., gap) 106. The sorption structure 110 is designed as a sorption wall that is used to selectively adsorb (during process) and desorb (during cleaning) the gases in the chamber, e.g., adsorb by-products while ensuring that the reactant gas(es) do not condense on the surface of the sorption structure 110. The sorption structure 110 includes a plurality of components and is connected to a pump 107 through a vacuum line 108.

FIG. 1A illustrates an example sorption structure 110 section that is defined in a portion of the wall 105 of the chamber 100 shown in FIG. 1, in accordance with one implementation. The sorption structure 110 is used to perform an adsorption step and a desorption step. The adsorption step is performed during processing of the substrate and the desorption step is performed after the substrates have been processed and when the sorption structure 110 has to be cleaned. The sorption structure 110 includes a plurality of layers with different features that are selectively engaged for performing the adsorption step and the desorption step. The sorption structure 110, for example, includes an inner section 111 with one or more heating elements 115 embedded within. In one embodiment, the heating elements 115 may be resistive heaters. The one or more heating elements 115 may be connected to a heat source through a heating cable and are used to heat the sorption structure 110 to a desired temperature during a desorption step.

The sorption structure 110 also includes a middle section 112 that is disposed adjacent to the inner section 111. A channel 122 is defined in the middle section 112 to allow a coolant to flow through so as to maintain the sorption structure 110 at a low temperature during an adsorption step. The size of the channel 122 may depend on the type of coolant used and the flow rate of the coolant needed for cooling the sorption structure 110. For a high flow rate, the channel size may be designed to be larger and for a low flow rate the size of the channel 122 may be designed to be smaller in diameter. The temperature at which the sorption structure 110 is cooled during the adsorption step depends on the type of process performed in the chamber, the condensation temperature of the reactant gas(es), the type of by-products that are being released, etc. The channel 122 may be part of a coolant flow delivery network 110a defined in the middle section 112. The coolant flow delivery network 110a includes one or more channels through which a coolant from a coolant source is circulated. Details of the coolant flow delivery network 110a will be described in detail with reference to FIGS. 2A and 2B.

The sorption structure 110 further includes a lattice structure defined adjacent to the middle section 112. An example lattice structure 114 is represented in FIG. 1A. In some implementation, the lattice structure 114 and the inner and middle sections are made of a single type of material. In alternate implementations, the lattice structure 114 may be made of one type of material while the inner and middle sections may be made of another type of material. The lattice structure 114 includes a network of interconnected beams with openings defined in a plurality of layers with each layer of the lattice structure 114 including a plurality of openings. The lattice structure 114 is defined such that an inner layer of the openings of the lattice structure 114 is disposed immediately adjacent to the middle section 112 and an outer layer of the openings of the lattice structure 114 faces an interior region of the chamber 100. The lattice structure 114 is designed such that the openings of each layer progressively increase in size starting from the inner layer having smallest-sized openings to the outer layer having the largest-sized openings. The size of the openings in each layer may be defined based on the type of by-products that are to be adsorbed. Alternately or additionally, the size of the openings of each layer may depend on the size of the gap defining the plasma processing region 106 within the chamber 100. As different chambers 100 have different sized gaps, the size of the openings in each layer of the lattice structure 114 may vary based on the size of the gap (i.e., plasma processing region) 106 defined between the upper and lower electrodes 102, 104.

In the example chamber 100 illustrated in FIG. 1, the sorption structure 110 is shown to be disposed directly on the chamber wall 105 in a portion that aligns with the gap 106 between the upper and lower electrodes 102, 104. FIG. 1 shows a vertical cross-sectional view of the chamber 100 showing the sorption structure 110 disposed on both sides of the chamber wall 105. The sorption structure 110 may be defined as a single piece that fits in the portion of the chamber wall 105. In this example chamber, the area between the outer edges of the upper and lower electrodes 102, 104 and the chamber wall 105 is shown to be open. In another implementation, the sorption structure 110 may be defined in a portion of an inner liner defined in the chamber 100. The inner liner is defined on the inner side of the chamber wall 105 and may run parallel to the chamber wall 105. Details of this implementation of the sorption structure 110 defined in a portion of the inner liner will be described in detail with reference to FIGS. 4 and 5.

In alternate implementations, a plasma confinement structure, such as a set of confinement rings are defined to extend between the outer edge of the upper electrode and the outer edge of the lower electrode, within the chamber 100. The confinement rings are a set of parallel rings that extend to enclose the gap 106. The confinement rings may be disposed in a horizontal orientation and extend vertically between the upper and lower electrodes. Details of the implementation of the sorption structure 110 in a chamber with confinement rings will be discussed in more detail with reference to FIG. 6A. In another implementation, the plasma confinement structure may be a C-shroud that is defined to extend between an outer edge of the upper electrode and the outer edge of the lower electrode such that the C-shroud encloses the gap 106. In this implementation, the sorption structure 110 is defined in a portion of the C-shroud. Details of this implementation with the sorption structure 110 defined on the C-shroud will be discussed in more details with FIG. 6B.

The lattice structure is connected to a vacuum line 108 that is coupled to a pump 107. The vacuum applied by the pump 107 together with the lattice structure 114 creates a low pressure region in the sorption structure 110. This low pressure region causes the by-products to flow toward the lattice structure 114 and be removed through the vacuum line 108 while minimizing the loss of the reactant gas(es) from the chamber 100. The lattice structure 114 with an increased surface area ensures that maximum amount of by-products get adsorbed on the lattice structure 114 while the frequency at which cleaning needs to be performed is reduced, leading to increased throughput. For instance, in example implementation illustrated in FIGS. 1 and 1A, the plasma generated within the chamber 100 has a pressure of about 40 mTorr while vacuum provided by the pump 107 allows a local pressure gradient to be defined at the lattice structure from about 40 mTorr at the outer layer that is exposed to the plasma processing region 106 to about 20 mTorr at the inner layer that is connected to the vacuum conduits and the vacuum line 108. This pressure gradient assists in the flow of the by-products toward the pump 107. The aforementioned plasma pressure and the pressure gradient are provided as mere examples and should not be considered restrictive. As the gas(es) pass through the different sized openings, the particulates and other by-products released within the chamber during processing of the substrate and, get adsorbed by the lattice structure. The architecture of the lattice structure is designed such that its effective thermal conductivity is sufficiently high to allow for rapid cooling and heating of the lattice beams. An example lattice structure with lattice beams will be described in detail with reference to FIGS. 7A and 7B.

For instance, the larger openings in the outer layer facing the inside of the chamber can assist in entry of greater amount of by-products toward the inner layers of the lattice structure and ensure that the by-products do not collect in one spot. In some implementations, the lattice structure may have a rough surface finish to improve adhesion of the by-products to the lattice structure 114, which also helps in delaying the micro-cracking of deposited film on the lattice structure. In alternate implementations, the lattice structure may be anodized (i.e., coated) to improve the adhesion of the by-products and their resilience in the harsh plasma environment. In some implementation, the lattice structure is made of aluminum. The implementations are not restricted to aluminum for constructing the lattice structure but may include any other material that is capable of providing the functionality of the lattice structure defined herein. In some implementations, the inner section and the middle section may also be constructed using aluminum. In some implementations, the low pressure region defined in the lattice structure enables the adsorbed by-products to diffuse from the outer layer into the inner layer of the lattice structure 114, allowing additional by-products to get adsorbed on the outer layer. The cooling of the sorption structure 110 and the vacuum flow is performed during the processing of the substrate in the chamber 100.

A primary vacuum line 113 is defined between the chamber 100 and the pump 107 to drain the reactant gas(es) and other chemistries from the chamber 100. A first end of the primary vacuum line 113 is coupled to the turbo pump 107 and a second end of the primary vacuum line 113 is connected to a bottom portion of the chamber 100.

In some implementations, a pressure sensor 131 is disposed along the vacuum line 108 between the sorption structure 110 and the pump 107. The pressure sensor 131 is used to monitor the pressure of the species exiting the sorption wall via the vacuum line 108 and may, in one implementation, be configured to generate a signal to a controller communicatively connected to the pressure sensor 131 of the chamber 100 when the pressure falls below a pre-defined threshold level. The drop in the pressure may be indicative of the amount of by-products that have deposited on the lattice structure, preventing flow of the gas(es) toward the vacuum line 108. When such drop in the pressure of the gas(es) flowing in the vacuum line 108 is detected, it would be desirable to perform a cleaning operation and the signal from the pressure sensor 131 may be used by the controller (not shown) to schedule the cleaning operation. In another implementation, the pressure sensor may provide the measured pressure of the gas(es) periodically to a controller, which can then use the pressure sensor readings to determine when a cleaning is needed.

The pre-defined threshold level may be expressed as falling below a specific pressure value expressed as pressure per square inch (psi), or as a percent (e.g., below 40%) of initial pressure value in the vacuum line 108, etc. The pre-defined threshold level may be provided as one of the chamber parameters. The controller may be a device that is communicatively connected to a computing device or may be an integral part of the computing device. The controller used to manage the operation of the chamber using a plurality of chamber parameters, may initiate the cleaning operation based on the signal from the pressure sensor 131. Details of the different components of the controller and their functionality will be described in detail with reference to FIG. 9.

In one implementation, in addition to the pressure sensor 131, a valve 132 may also be provided along the vacuum line 108 between the pressure sensor 131 and the pump 107 to control the pressure of vacuum line 108 on the sorption structure 110. The valve 132 is configured to control the operation of the vacuum line 108. The valve 132 may be of any type, such as a gate valve, a globe valve, a check valve, a plug valve, a ball valve, a butterfly valve, etc., that operate using pneumatic or any other form of actuators. The aforementioned examples of valves are provided as samples and should not be considered exhaustive or limiting.

When it is time to perform a desorption step to clean the buildup on the lattice structure 114, selected components of the sorption structure 110 are used. For example, the desorption step is performed using the heating elements from the inner section 111 and vacuum line 108 from the lattice structure 114. The desorption step is performed when no substrates are present in the chamber 100 (i.e., engages WAC/CWAC process). In the desorption step, the valve 132 in the vacuum line 108 is adjusted to turn off the local pressure. The heating elements 115 included in the inner section 111 are activated to provide the heat to the sorption structure 110 so as to heat the sorption structure 110 to a temperature that is sufficient to release the by-products that have adhered to the lattice structure 114 while the WAC/CWAC is being performed. It should be noted that the heating elements 115 is one way of heating the sorption structure 110 and that other ways of heating the sorption structure 110, such as resistive heaters, warm fluid flow through appropriate channels, etc., may also be employed. The temperature to which the lattice structure 114 has to be heated depends on the type of process that is being performed in the chamber 100, the type of by-products that are released, the type of material used in the lattice structure 114, etc. The released by-products are then purged out of the chamber 100. In some implementation, the chamber 100 may have some left-over reactant gas(es) from the substrate processing and the by-products released from the surface of the lattice structure 114 may mix with the left-over reactant gas(es) and get purged out of the chamber 100. In some implementation, the by-products may be purged through the primary vacuum line 113. After the desorption step, the chamber 100 is ready to receive a substrate for processing.

The inputs and outputs to the various components of the sorption structure 110 may be routed through the backside (i.e., outer side) of the chamber wall 105, in some implementation. In alternate implementations, the inputs and outputs may be routed through the lower electrode 104 or through the upper electrode 102 or outside of the inner liner, if the sorption structure 110 is defined on a portion of the inner liner. In some implementations, the inputs and outputs of the sorption structure 110 may all be routed through a facility line defined for the chamber 100 through which other inputs and outputs to the chamber 100 are being routed.

FIG. 2 illustrates the various components of an example sorption structure that is integrated into a portion of a chamber wall 105 of chamber 100, in one implementation. The components of the sorption structure 110 include an inner section 111, a middle section 112 and a lattice structure section 114. The sorption structure 110 is used to perform two steps—an adsorption step and a desorption step, and different components of the sorption structure 110 are used for performing these two steps. The adsorption step is used to adsorb the by-products generated in the chamber 100, and is performed during processing of the substrate. The middle section 112 and the lattice structure 114 of the sorption structure 110 are used in adsorbing the by-products into lattice structure 114. The desorption step is used to release the adsorbed by-products from the lattice structure 114 so that they can be removed from the chamber 100, and is performed as part of WAC/CWAC process when no process wafers are present in the chamber 100. However, a dummy wafer may be placed on ESC during CWAC to protect ESC from damage caused by plasma. The inner section 111 is used to provide the heat to the lattice structure 114 during the desorption step.

Figure 2A:
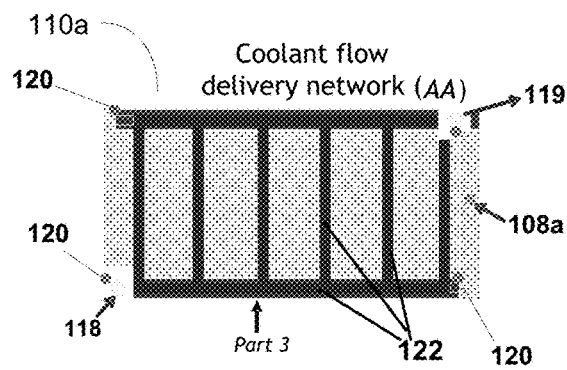
FIG. 2A illustrates an expanded view of a vacuum line network defined in the sorption structure, in accordance with one implementation of the present disclosure.

FIG. 2A illustrates details of a coolant flow delivery network 110a (represented by cross-section "A-A" in FIG. 2) defined in the middle section 112. The coolant flow delivery network 110a is used to cool the sorption structure 110 to a temperature that is cold enough to adsorb the by-products (e.g., etch by-products from an etch operation) but yet is not cold enough to condense the one or more reactant gases used in the chamber 100 to generate the plasma. Accordingly, the coolant flow delivery network 110a includes a coolant inlet 118 to receive the coolant from a coolant source (not shown), one or more channels 122 to circulate the coolant and a coolant outlet 119 through which the coolant flows out and is re-introduced through the coolant inlet 118. The temperature for cooling the sorption structure 110 may be defined based on type of material used in constructing the sorption structure 110, the type of reactant gas(es) used in the chamber 100, the type of by-products that are generated, etc. The coolant flow delivery network 110a may be manufactured as a single unit using a machine tool (e.g., a 3D printer) and integrated with other components of the sorption structure 110. A plurality of O-rings 120 is provided to allow the coolant flow delivery network component 110a to couple with the remaining components of the sorption structure 110.

The lattice structure 114 includes a network of openings distributed in a plurality of layers, with an inner layer 114a of the lattice structure 114 disposed adjacent to the middle section 112 and an outer layer 114b of the lattice structure 114 facing an interior region of the chamber 100. The openings of each layer progressively increase in size from the inner layer (i.e., openings in the inner layer) 114a to the outer layer 114b (i.e., openings in the outer layer). The size of the openings in the lattice structure 114 are defined based on a number of variable factors, such as type of by-products being released, type of process being performed in the chamber 100, the type of reactant gas(es) used in the chamber 100, amount of gap defined between the upper and the lower electrodes 102, 104, to name a few. Of course, the aforementioned list of variable factors is provided as an example and fewer or greater number of variable factors may be considered when determining the topology of the lattice structure.

Figure 2B:
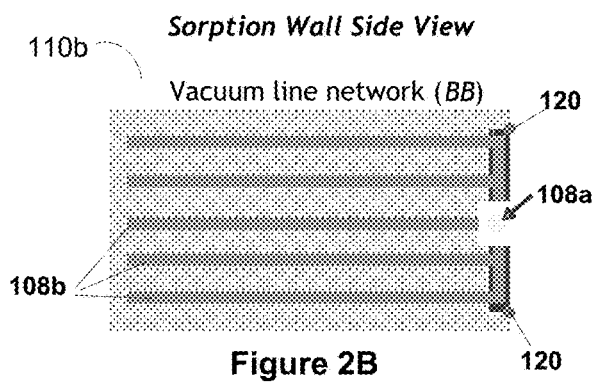
FIG. 2B illustrates an expanded view of a coolant flow delivery network defined in the sorption structure, in accordance with one implementation of the present disclosure.

FIG. 2B illustrates an expanded view of the cross-section "B-B" of the vacuum line network 110b illustrated in FIG. 2. The vacuum line network 110b is coupled to the inner layer 114a of the lattice structure 114. The vacuum line network 110b includes a vacuum inlet 108a that is coupled to a pump 107 through a vacuum line 108. The vacuum line 108 extends between the pump 107 and the inner layer 114a of the lattice structure 114 such that a first portion of the vacuum line 108 is defined outside the sorption structure and a second portion of the vacuum line 108 is defined within the middle section where it connects to a network of vacuum conduits 108b defined within the sorption structure 110. The pump 107 coupled to the first portion of the vacuum line 108 is also disposed outside the sorption structure 110. The pump 107 provides the vacuum to create a low pressure region in an area covered by the lattice structure 114 to assist in the removal of the less condensable by-products released within the chamber 100. A pressure sensor 131 defined along the vacuum line 108 and disposed between the lattice structure 114 and the pump 107 is used to monitor the pressure of the gas(es) exiting the chamber 100 via the vacuum line 108 and to generate a signal when the level of suction provided by the vacuum line 108 gets adversely affected (i.e., the pressure of the gas flowing through the vacuum line 108 falls below a predefined threshold value) so that the desorption step can be initiated. The drop in the pressure of the gas flowing in the vacuum line 108 may be indicative of the amount of by-product film build-up on the lattice structure 114. The coolant flow network 110a and the vacuum line network 110b may be created as separate units and coupled with other components of the sorption structure 110 using a set of O-rings 120. The middle section with the coolant flow delivery network 110a and the vacuum line network 110b along with the lattice structure 114 are used during the adsorption step to adsorb the by-products within the lattice structure 114.

The components included in the inner section 111 are used to release the by-products that have adhered to the lattice structure 114 during the desorption step, in one implementation. The inner section 111 includes one or more heating elements 115 that may be connected to one another and to a power source through a heating cable 117. The heating elements 115 may be resistive heaters or any other type of heaters that are used to heat the sorption structure 110 to a temperature that is sufficient to release the by-products. During the desorption step, the low pressure created locally by the vacuum from the pump 107 is turned off, and the WAC/CWAC is performed while the heating elements 115 are turned on. The released by-products are removed from the primary vacuum line 113 defined between the bottom of the chamber 100 and the pump 107. The released by-products may be removed along with any remaining reactant gas(es). Alternately, a second gas may be introduced into the chamber 100 from a second gas source through a corresponding gas feed (not shown) to better assist in removal of the by-products released by the heated lattice structure 114 during WAC/CWAC.

Each of the components, inner section 111, middle section 112 and the lattice structure 114 may be separately created using machine tools with necessary channels to route inputs and outputs from the inner components and may be coupled together using the O-rings to form a single sorption structure unit. Further, as mentioned earlier, the coolant flow delivery network 110a and the vacuum line network 110b may be created as separate units and coupled to the middle section 112, and the middle section 112 is coupled to the lattice structure 114 on one side and to the inner section on the opposite side using the corresponding O-rings 120.

A portion of the chamber wall 105 of the chamber 100 aligning with a gap 106 defined between the upper electrode and the lower electrode (102, 104) is identified, and the sorption structure 110 is integrated in this portion of the chamber wall 105. An inner side of this portion of the chamber wall 105 includes a plurality of O-rings 120 to allow the sorption structure 110 to tightly couple with the inner side of the chamber wall 105. The chamber wall 105 also includes a plurality of channels to route the inputs and outputs of the sorption structure 110 and these channels align with the corresponding inputs/outputs channels defined in the sorption structure 110. For example, a first channel (coolant inlet channel 118a) may be defined in the chamber wall 105 to route a coolant inlet 118, a second channel 117a may be defined to route a heating cable 117, a third channel 108c may be defined to route the vacuum line 108 and a fourth channel 119a may be defined to route the coolant outlet 119. In an alternate implementation, the various inputs and outputs of the sorption structure 110 may be routed down through the lower electrode 104 instead of routing through the chamber wall 105. In other implementations, the various inputs and outputs of the sorption structure 110 may be routed through the upper electrode 102.

In some implementations, the various components of the sorption structure 110 may be manufactured using a machine tool, such as a computer numerical control (CNC) machine, or a three-dimensional (3D) printer tool. In other implementations, the components of the sorption structure 110 may be manufactured using a 6-axis 3D printer. In some implementations, the different components of the sorption structure are made of a single material, such as Aluminum. In alternate implementations, each of the different components may be made of different material (e.g., metal or ceramic). In this implementation, the lattice structure 114 may be made of Aluminum and the inner section 111 and the middle section 112 may be made of a different material that is different from Aluminum. The inner section 111 and the middle section 112 may be made of a conductive material (i.e., metal) that is different from Aluminum. The lattice structure may also be coated with a secondary material.

Figure 3:
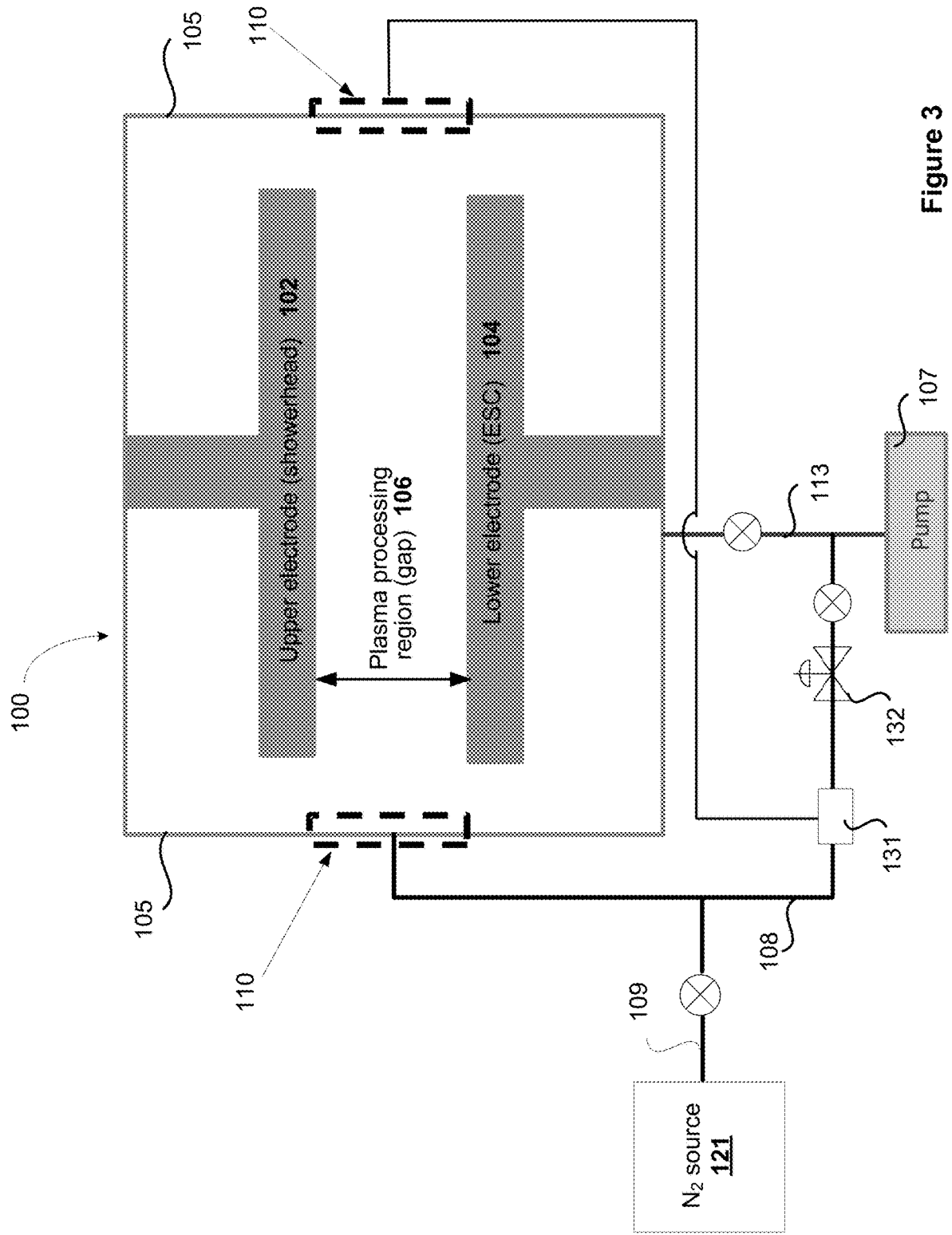
FIG. 3 illustrates a simplified view of an alternate etch chamber with a sorption structure defined thereon, in accordance with one implementation of the present disclosure.

FIG. 3 illustrates an alternate implementation of the sorption structure 110 used to capture and remove the by-products. In this alternate implementation, the cleaning of the by-products that have adhered to the lattice structure 114 (i.e., desorption step) are done by engaging a Gas Purge AutoClean (GPAC) by blowing high-pressure gas, such as Nitrogen, from the back side (i.e., the inner layer 114a) of the lattice structure 114 so as to release the by-products, such as polymer film, that have adhered to the surface of the lattice structure 114. The high-pressure gas may exert sufficient force on the by-products to cause the by-products to release from the lattice structure 114. In this implementation, the desorption step may rely on the high-pressure gas instead of the heating elements 115 in order to release the by-products that have adhered to the lattice structure 114. To minimize design changes, the existing vacuum line 108 that is already connected to the inner layer 114a of the lattice structure 114 may be used to supply the high-pressure gas, instead of adding an additional channel. This design is shown in FIG. 3. A third line 109 is defined such that a first end of the third line 109 is coupled to the vacuum line 108 and a second end is connected to a gas source, such as a Nitrogen gas source 121. A valve in the third line 109 and the valve 132 in the vacuum line 108 may work together to (a) shut off the low pressure from the pump 107, and (b) control the speed of flow of the Nitrogen gas into the chamber 100. The Nitrogen gas supplied from the gas source 121 is configured to flow from the inner layer 114a of the lattice structure 114 to the outer layer 114b. In some implementations, a sensor (not shown) may be used to ensure that the Nitrogen gas is being delivered to the lattice structure 114 at specific pressure or flow rate. The signal from the pressure sensor can be used to adjust the N2 flow rate by actively controlling a GPAC valve defined on the third line 109.

During the desorption step, the high-pressure flow of the Nitrogen gas forces the by-products that have adhered to the lattice structure surface to be released into the chamber 100. The released by-products are removed (i.e., purged) with the Nitrogen gas via the primary vacuum line 113 by operating a corresponding valve on the primary vacuum line 113. In an alternate implementation, a separate gas inlet line may be defined such that a first end of the separate gas inlet line is connected to a gas source and a second end is connected to a back side (i.e., inner layer 114a) of the lattice structure 114. As in FIG. 1, the sorption structure in FIG. 3 is shown to be defined in a portion of the chamber wall 105.

In the implementation illustrated in FIG. 3, the vacuum line 108 continues to be used, during the adsorption step, to provide the low pressure region on the lattice structure 114 so that the by-products can be adsorbed by the lattice structure 114. The vacuum line 108 forms the second outlet for the by-products to escape through. The expansive surface of the lattice structure 114 and the vacuum introduced through the vacuum line 108 causes a low pressure gradient at the lattice structure 114. Thus, during the adsorption step, the low pressure region at the lattice structure 114 ensures that maximum amount of by-products are captured and minimal amount of reactant gas(es) are lost.

In some implementation, the desorption step may use both the heating elements 115 and the high-pressure gas to clean the by-product build-up on the lattice structure 114. In such implementation, the GPAC may be engaged in conjunction with WAC/CWAC to release and remove the by-products that have deposited on the lattice structure 114. The heating elements 115 in the inner layer 111 of the sorption structure 110 may be used to heat the sorption structure 110 and the high-pressure gas from the gas source 121 may be introduced through the vacuum line 108 and the vacuum conduits coupled to the inner layer 114a of the lattice structure 114. The effect of both the heat and the high-pressure gas may assist in a faster release of the by-products from the lattice structure 114. The released by-products may be removed via the primary vacuum line 113. In other implementations, a combination of WAC or CWAC and GPAC may need to be performed alternatively for a more efficient desorption.

FIG. 4A illustrates an alternate implementation of a chamber 100 in which the sorption structure 110 is disposed. In this implementation, the chamber 100 includes an inner liner 125 that is defined along an entirety of an inner side of the chamber wall 105 and the sorption structure 110 is defined in portions of the inner liner 125. The sorption structure 110 is created as a sectional piece with a defined length and width, and the implementation illustrated in FIG. 4A includes the sorption structure sections 110 distributed uniformly along different portions of the inner liner 125 and are disposed orthogonal to one another. The portions of the inner liner 125 where the sorption structure sections 110 are defined are identified to align with the gap between the upper and the lower electrodes. The portions of the inner liner 125 are identified based on the likelihood of the by-products adhering to the inner liner 125. In some implementations, the inputs and outputs of the sorption structure sections 110 are routed to the back side of the inner wall. The routed inputs and outputs are eventually connected to a controller (not shown) alongside other facility lines. The operational parameters provided to the controller include parameters to operate the sorption structure 110. Some of the operational parameters to control the sorption structure may include the differential pressure that needs to be provided by the pump along the vacuum line 108, temperature to which the coolant needs to cool the sorption structure during an adsorption step, temperature to which the heating elements need to heat the sorption structure during the desorption step, etc. As mentioned earlier, these operational parameters may, for example, be dependent on the type of operation that is being performed in the chamber 100, the type of reactant gas(es) used to perform the operation in the chamber, the type of by-products that are being released, the type of substrate used, size of gap defined between the upper and the lower electrodes, size of the openings in the different layers of the lattice structure, etc.

In the implementation illustrated in FIG. 4A, the inputs and outputs (i.e., vacuum line 108, heating cable 117, coolant inlet 118, coolant outlet 119) from each sorption structure section 110 are separately routed to the back side of the chamber wall 105 through corresponding channels defined in the inner liner 125 and the chamber wall 105. Alternately, the like-type inputs and outputs from each of the sorption structure section 110 may be linked together and routed to the back of the inner liner 125 or to the back of the chamber wall 105 through channels in the inner liner 125 and the chamber wall 105. In alternate implementation, the inputs and outputs from each of the sorption structure sections 110 may be routed to the back of the inner liner 125 and then down to the lower electrode 104 and out through a channel that houses the facility lines of the lower electrode 104 and/or chamber 100. Thus, based on the design of the chamber 100 and the sorption structure sections 110, the inputs and outputs of the sorption structure sections 110 are appropriately routed to the controller so as to allow the controller to manage the functions of the sorption structure 110.

Figure 4B:
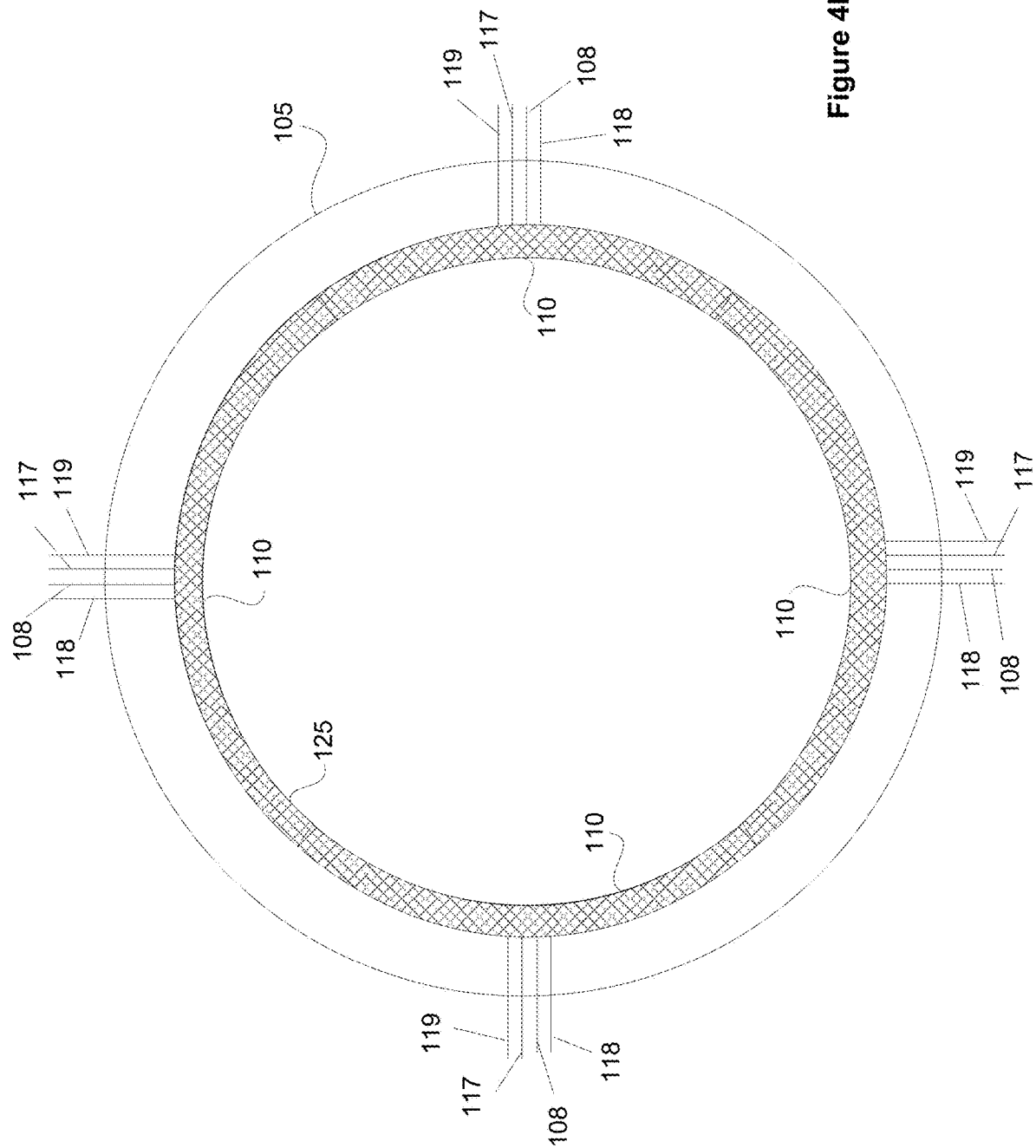
FIG. 4B illustrates a simplified overhead view of an etch chamber identifying some chamber parts and a second example configuration of a sectional sorption structure, in accordance with an alternate implementation.

FIG. 4B illustrates an alternate implementation of sorption wall structure shown in FIG. 4A. In this implementation, the sorption structure 110 is disposed along an entire section (360°) of a portion of the inner liner 125 that is defined along an entirety of an inner side of the chamber wall 105. The sorption structure is in the form of a sectional piece with a defined length and width and the implementation illustrated in FIG. 4B shows 4 sorption structure sections 110 each covering 90 degrees and distributed orthogonal to one another. In some implementations, the sorption structure can be made of one piece covering the entire section. The portion where the sorption structure sections 110 are disposed on the inner liner 125 so as to align with the gap between the upper and the lower electrodes. The inputs and outputs (i.e., vacuum line 108, heating cable 117, coolant inlet 118, and coolant outlet 119) of the sorption structure sections 110 are separately routed through corresponding channels defined in the inner wall 125 and the chamber wall 105. The routed inputs and outputs are eventually connected to a controller (not shown) alongside other facility lines to allow the controller to manage the functions of the sorption wall. The routing of the inputs and outputs are provided as an example and that other ways of routing the inputs and outputs described with reference to FIG. 4A may also be employed.

Figure 5:
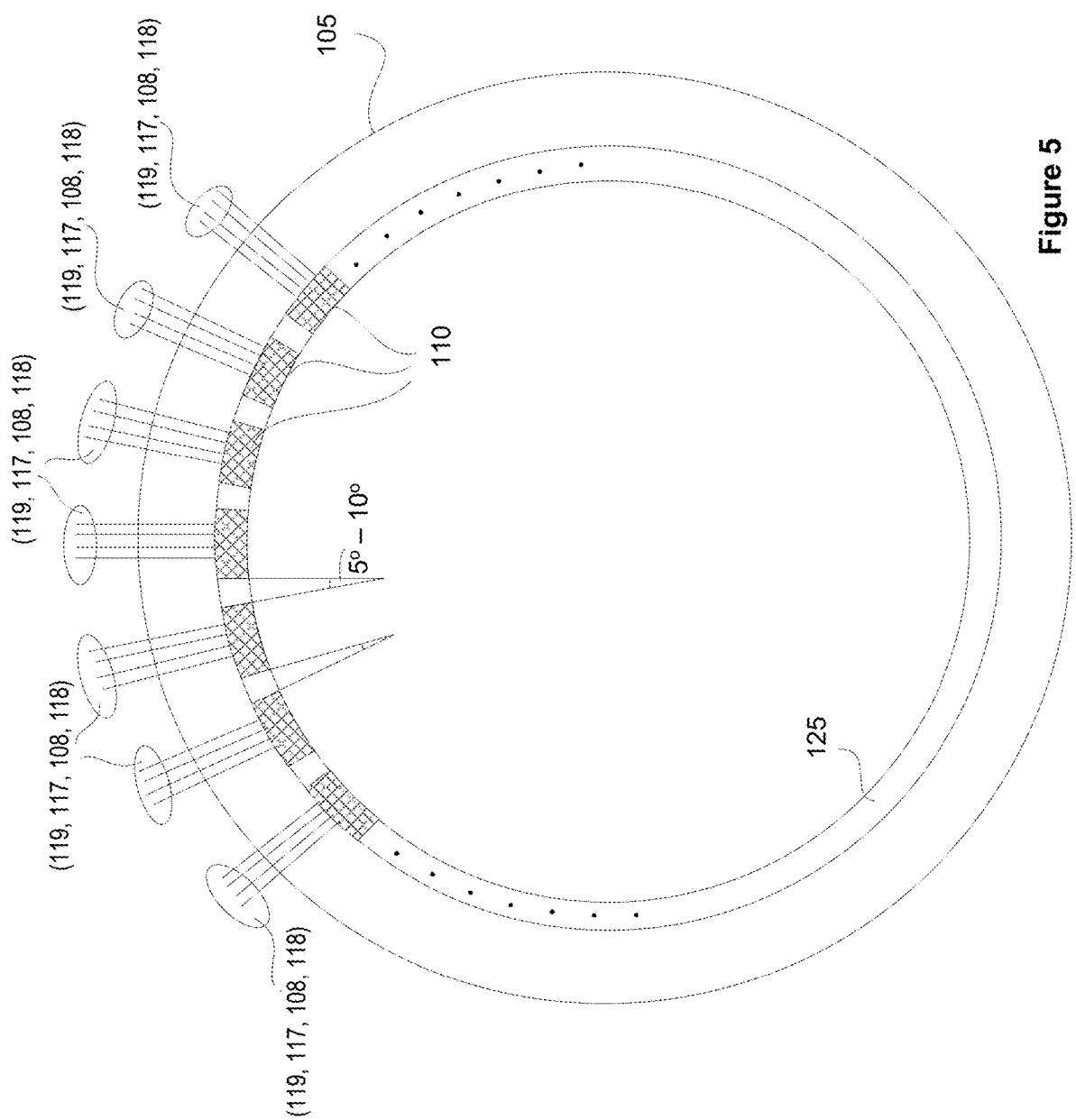
FIG. 5 illustrates a simplified overhead view of an etch chamber with an alternate example configuration of the sorption structure, in accordance with one implementation of the present disclosure.

FIG. 5 illustrates an alternate implementation of the chamber 100 that includes the sorption structure 110. The implementation illustrated in FIG. 5 includes sorption structure 110 that are defined as small sections. These sorption structure sections 110 are distributed along the inner liner 125. However, unlike the sorption structure sections of FIGS. 4A and 4B that are separated orthogonally from one another, the sorption structure sections of FIG. 5 are disposed close to one another with a specific angle of separation of about 5° to about 10°. The small angle of separation between the sorption structure sections 110 is to ensure that there is sufficient surface area of the inner liner 125 that is covered by the sorption structure sections 110 so as to prevent the by-products from adhering to the surface of the inner liner 125. Further, the smaller sections of sorption structures 110 are easier and cheaper to manufacture using the 3D printer or other machine tools. The inlets/outlets from each of the sections are routed out separately or inlets/outlets of each type may be combined together and routed out. Although smaller sections may be cost-effective for manufacturing, the routing of the inlets/outlets may add to the cost and/or complexity. Appropriate design may be selected based on individual chamber design. In the implementations where the sorption structure sections are manufactured using the 3D printer, the backside wall of the sorption structure 110 may be straight and the front side wall arced, or both the backside and the front side walls may be arced to match the curvature of the inner liner or both the backside and the front side walls may be straight. In the implementation where both the back and the front sides of the sectional sorption structure 110 are straight, the small dimension of the sectional sorption structures may allow the sorption structure to follow the curvature of the inner liner 125. Alternately, the sorption structure sections may be molded using the 3D printer into blocks that are rectangular. This implementation of FIG. 5 where the sorption structure sections 110 are disposed around the inner liner 125 can also be extended to the implementation where the sorption structure sections 110 are disposed directly on the chamber wall 105 in the portions that align with the gap defined between the upper and lower electrodes.

FIG. 6A illustrates another implementation where the sorption structures are disposed on the chamber wall 105 of the chamber 100 and is disposed outside of a plasma confinement structure, such as plasma confinement rings 126, defined in the chamber. In this implementation, a set of plasma confinement rings 126 are defined to extend between a peripheral edge of the upper electrode 102 and a peripheral edge of the lower electrode 104 so that the plasma created by the ionization of the reactant gas(es) is confined within the small plasma processing region 106 defined between the confinement rings 126 and between the corresponding surfaces of the electrodes 102, 104. The confinement rings 126 may be constructed of a dielectric material, such as silica or quartz. Spacers are defined between adjacent rings, such that passages defined by the spacers provide a path for the plasma to escape. The spacers may be constructed with dielectric material, such as silica or quartz. Alternately, the spacers may be constructed with conducting materials. The sorption structure 110 is defined outside the region where the confinement rings 126 are defined, and is aligned with the confinement rings 126 so that the plasma and the by-products escaping out of the plasma process chamber can be adsorbed in the lattice structure 114 of the sorption structure 110.

FIG. 6B illustrates an alternate implementation of a chamber with a plasma confinement structure in which one or more sorption structure(s) 110 are disposed. In this implementation, the upper electrode is connected to a gas source (not shown) to provide reactant gas(es) to the plasma processing region 106, and to a power source (not shown), such as an RF power source, to generate plasma from the reactant gas(es). The lower electrode is electrically grounded. The plasma confinement structure in the form of a C-shroud 127 extends from an outer edge of the top outer electrode 102 to an outer side surface of the bottom electrode 104 to provide additional plasma containment. The C-shroud 114 has a plurality of apertures defined along a bottom surface to allow gas(es) and plasma to flow out of the C-shroud 127. In this implementation, the C-shroud 127 is grounded. A portion of the C-shroud 127 that aligns with the gap between the upper and the lower electrodes (102, 104) is identified and the sorption structure 110 is defined in the identified portion of the C-shroud 127. The vacuum line 108 extending from the sorption structure 110 to the outside of the chamber 100 connects the sorption structure 110 to the pump 107. In some implementation, the vacuum line 108 includes a pressure sensor 131 defined between the sorption structure 110 and the pump 107, and a valve 132 to control a level of vacuum applied through the vacuum line 108. A primary vacuum line 113 is provided between the bottom surface of the chamber 100 and the pump 107 which provides the main route to drain the reactant gas, neutral species and by-products escaping from the plasma processing region 106.

The lattice structure may be generated using a 3D printer, in one implementation. The 3D printer can manufacture the topology of the lattice structure to carefully define topology of lattice unit cells (e.g., beams diameter and length, beams arrangement, the arrangement of the unit cells, etc.), in the various layers of the lattice structure to maximize the surface area of the sorption structure, minimize plasma leakage into the lattice structure, and control the temperature distribution through the lattice structure thickness. In some implementation, a combination of other architected materials, such as open cell metal foam, honeycomb structure, or perforated plates can be used instead of 3D printed lattice structures.

In some implementations, the lattice structure is a metal lattice. In some other implementation, open cell metal foam with optimized topology (cell size, through hole rate, porosity, surface roughness, etc.) can be used instead of the metal lattice. Due to low cost of metal foams they can be used as consumable parts in which the metal foam is removed from the chamber after being used for some time and replaced by a new one either manually or via wafer handling robot. The lattice structure or metal foam will have optimized surface roughness to further assist with delaying the micro-cracking of the deposited by-product films. Other architected materials, such as a honeycomb structure with perforated plate, can also be used instead of metal foam to increase wall surface area. It can be appreciated that in some implementations the embedded heating elements, the side vacuum network and GPAC may not be required.

Figure 7A:
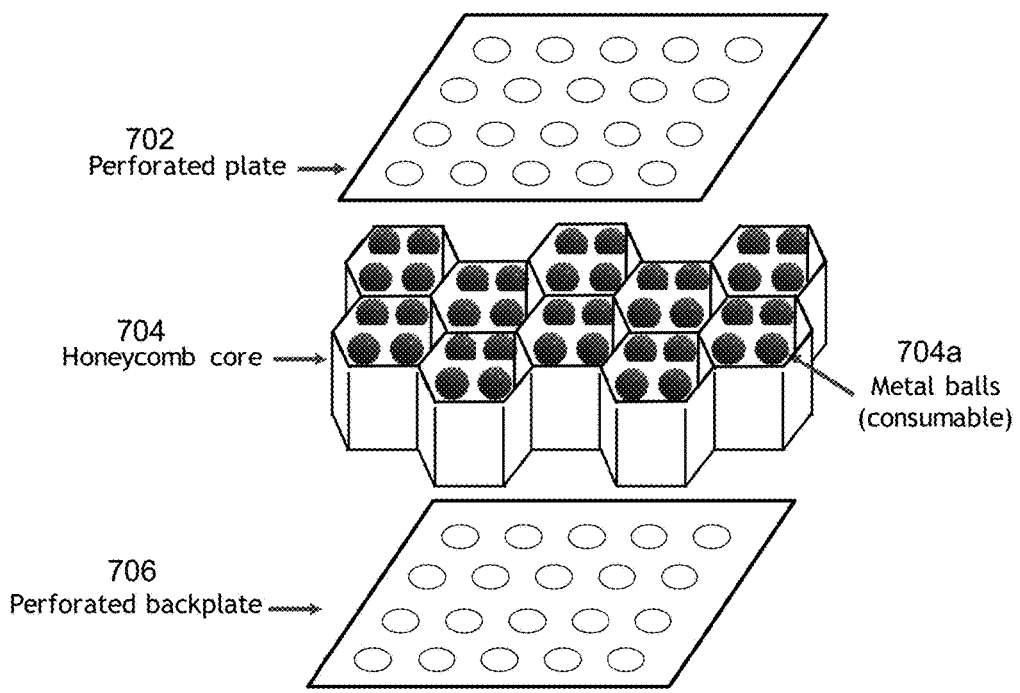
FIG. 7A illustrates a simplified block diagram of an example architected material employed in the sorption wall to adsorb the by-products, in accordance with one implementation of the present disclosure.
Figure 7B:
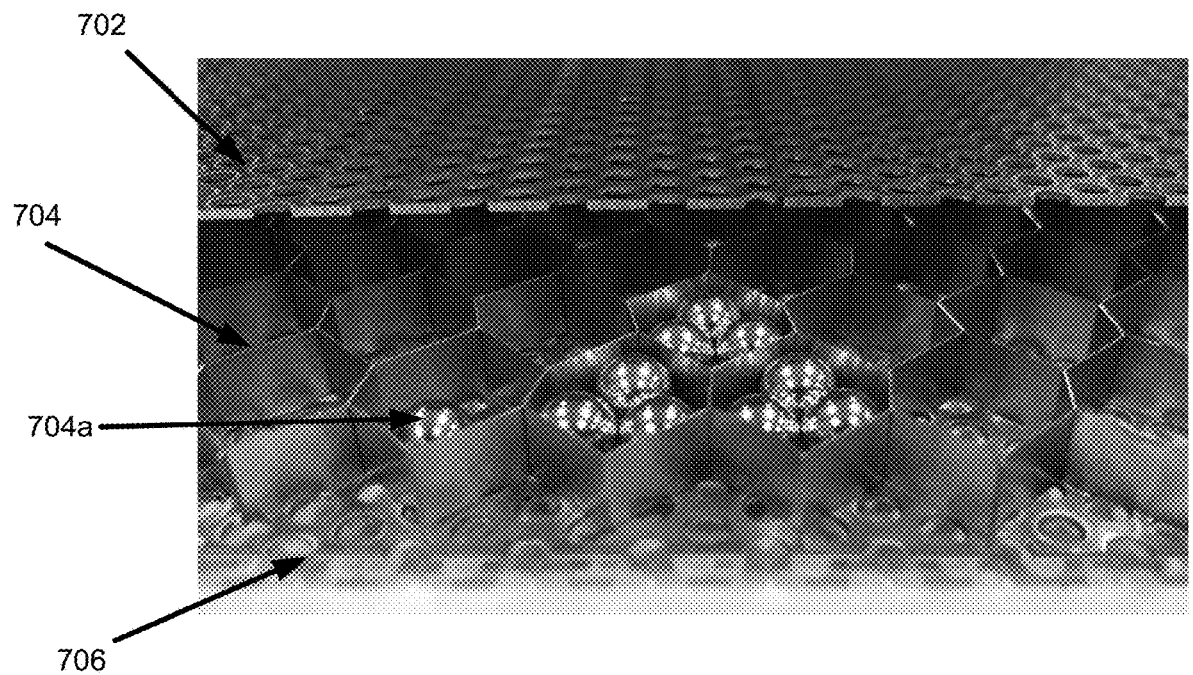
FIG. 7B illustrates an example of an architected material showing the different components identified in FIG. 7A, in accordance with one implementation.

FIG. 7A illustrates a simple block diagram of an example architected material, such as honeycomb structure, used in the sorption wall to provide large sorption wall surface area for adsorbing the by-products released in the chamber, in one example implementation. FIG. 7B illustrates an example of architected material that is designed for use in the sorption wall of the chamber for adsorbing the by-products released in the chamber. The lattice structure, in this implementation, includes a perforated top plate 702 that forms the outer or top layer of the lattice structure. A honeycomb core 704 is disposed below the perforated top plate 702. The honeycomb core 704 may be filled with metal balls 704a to achieve higher surface area. The metal balls 704a in the honeycomb core 704 are pre-compressed by the perforated top plate 702. In one example implementation, the pre-compressing is done using metal bolts for establishing good contact so that good heat conduction can be realized. It should be noted that the metal bolt is one example of a fastening structure that can be used for attaching the honeycomb core 704 to the perforated top plate 702 and other types of fastening materials, or structures, or devices can also be used. A perforated back plate 706 forms the bottom side of the architected material lattice structure in the implementation illustrated in FIGS. 7A and 7B. In alternate implementation, a solid back plate may be used instead of the perforated back plate. The perforated back plate 706 may be used to connect to the middle section of the sorption wall. In some implementation, the perforated top plate 702 and the honeycomb core 704 can be cleaned via WAC. The metal balls 704a can be consumable items and may be periodically replaced. The lattice structure shown in FIGS. 7A and 7B can be assembled using commonly occurring off-the-shelf components to reduce cost. The lattice structure in this implementation is a ball-filled hexagon honeycomb core 704 sandwiched between the perforated top plate 702 and the perforated back plate 706.

The controller is used to manage the primary operational parameters during the adsorption step and the desorption step. These primary operational parameters may be influenced by the design parameters selected for successful adsorption and removal of the by-products. For instance, some of the primary operational parameters that may have to be controlled during the adsorption step may include wall temperature, and vacuum pressure for the vacuum line. Similarly, primary operational parameters that may have to be controlled during the desorption step may include temperature to which the sorption structure needs to be heated, duration of the desorption step, WAC/CWAC recipe, and frequency at which the desorption step needs to be performed. For example, for the adsorption step, type of coolant selected may be based on temperature to which the sorption structure has to be cooled during the adsorption step. Similarly, coolant flow rate may be dependent on the type of coolant selected. Coolant delivery topology may be based on the coolant flow rate. Similarly, lattice topology may define the surface area that is provided for capturing the by-products. Along similar lines, the power used for heating the sorption structure during the desorption step may be based on the temperature to which the sorption structure has to be raised and the time duration for maintaining the raised temperature. The number of heating elements, arrangement of the heating elements in the inner layer of the sorption structure and the spacing between the heating elements may be based on the power of the heating elements.

The controller is connected to various components of the plasma process chamber including the gas source, the bias RF source, the upper electrode, the lower electrode, the exhaust pump 107, and to the different components of the sorption structure including the pressure sensor, the valve, gas source, heating elements, coolant source, to name a few. The controller controls the flow of the etch gas into the plasma process chamber, the chamber pressure, as well as the generation of the RF power from the RF sources, the upper and lower electrodes 102, 104, and the exhaust pump 120. The controller also controls the level of vacuum provided through the vacuum line 108, the flow of high-pressure gas to the lattice from the gas source (e.g., $N_2$ gas source 121), when high-pressure gas is used, and the operation of the valves (132, etc.), and sensors (e.g., 131, etc.) along the vacuum line. The vacuum line 108 provides an additional flow path from the chamber to remove the by-products while the vacuum line 113 provides a regular path through which the gases and by-products are removed from the chamber. The vacuum line 108 shown outside the chamber is connected to the network of vacuum conduits defined inside the middle section and connected to the inner layer 114a of the lattice structure 114 to remove the by-products from the chamber. The low pressure region defined by the vacuum line ensures that minimal amount of reactant gases are removed from the chamber. The temperature to which the sorption structure is set during adsorption step is based on the type of gases used, the type of process performed and type of process recipe used in the chamber. In one example implementation, the temperature may be determined based on type of material used in the lattice structure, the dimensions of the sorption structure, the thermal conductivity of the lattice portion, the speed of creating the temperature delta to affect the flow rate in the vacuum line, process recipe being used, amount of time the temperature has to be maintained, etc. In some implementations, depending on the process recipe and the type of process that is being conducted within the plasma process chamber, the desorption step may be performed after processing 100 substrates. In other implementations, the desorption step may be performed after fewer or greater number of substrates have been processed.

In some implementation, the topology of the lattice structure 114 is defined based on the amount of gap defined between the upper and lower electrodes. Since different process chambers (i.e., process modules) may have different sized gaps between the upper and lower electrodes, the topology of the lattice structure is determined in accordance to the such gap in different chambers. In one example implementation, if the gap between the upper and the lower electrodes is about 10 mm, then the lattice openings (unit cell characteristic length) in the outer layer 114b may be about 1 mm in size and the openings in the inner layer 114a may be about 0.1 mm. In another example implementation, the gap between the electrodes may be between about 2" to about 3". In this implementation, the size of each opening in the outer layer may be defined to be about $1/10^{th}$ the size of the gap and the size of each opening in the inner layer may be defined to be about $1/100^{th}$ the size of the gap. In some implementations, the sorption structure is defined on the portion of the chamber wall or the inner liner such that the bottom part of the sorption structure 110 is at a height that is in line with or just above (e.g., about 1-3 mm below) a top surface of the lower electrode and the top part of the sorption structure 110 is disposed at a height that is in line with or just below (e.g., about 1-3 mm above) a bottom surface of the upper electrode as the region between the upper and the lower electrodes is where the plasma is occurring and the by-products are being released. The large surface area and low temperature as well as the low pressure region define the features of the adsorptive sorption structure that is effective in removing the by-products. The pressure difference defined in the lattice structure is large enough to create a suction field to attract "near field" particles (i.e., near the wall area) but is not too large to affect "far field" plasma particles (i.e., particles that are contained in the plasma processing region). In addition to the surface area and low temperature attributes, the network of openings assists in attracting the by-products to the sorption structure.

Figure 8:
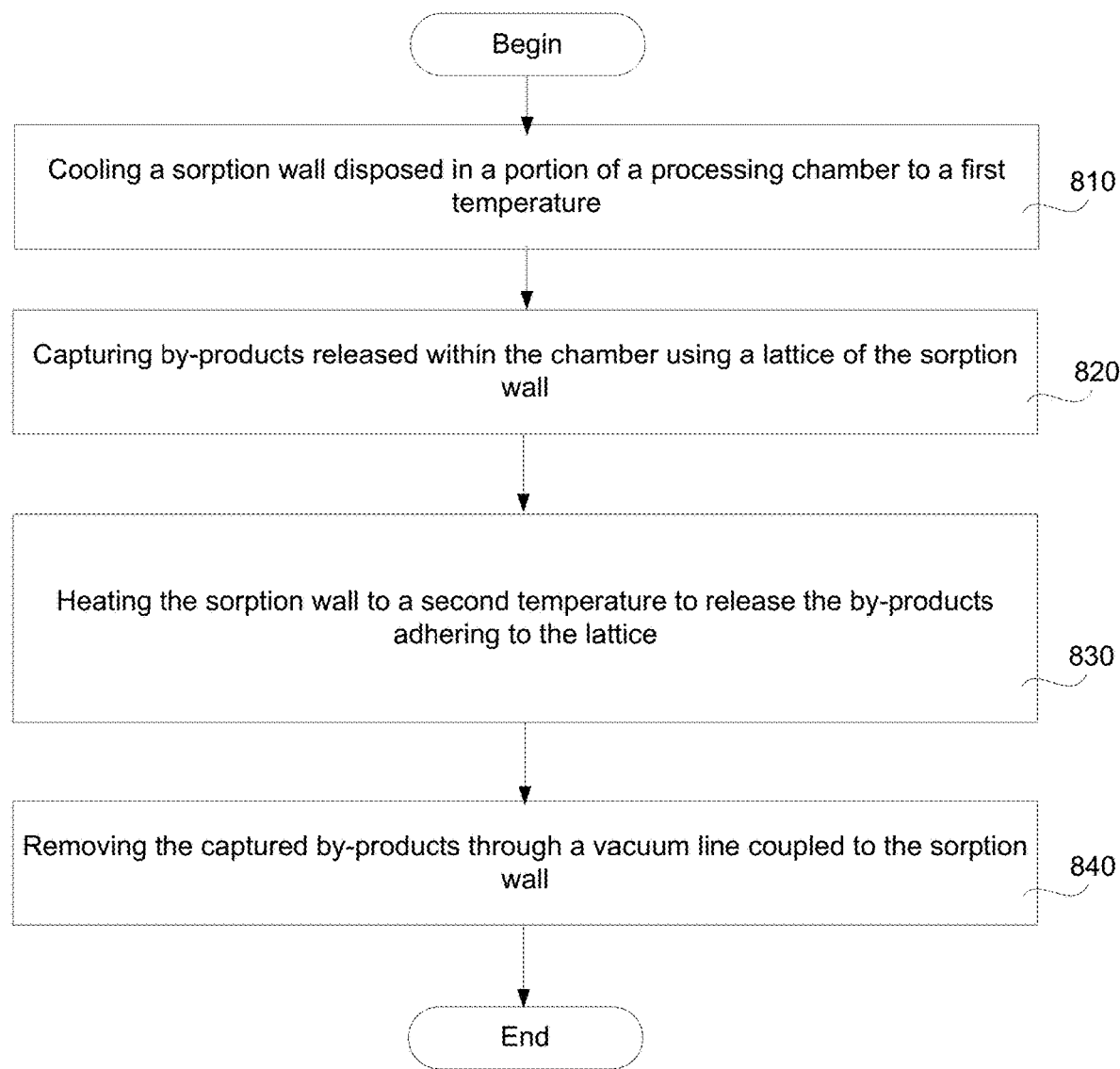
FIG. 8 illustrates an example method of using sorption structure to adsorb and remove by-products released in the chamber, in accordance with one implementation of the present disclosure.

FIG. 8 is a flow diagram of a method used for adsorbing and removing by-products from a process chamber that is used for processing a substrate, in one implementation. The method begins at operation 810, wherein a sorption structure defined in a portion of a chamber wall of the process chamber is cooled to a first temperature. The process chamber may be an etch chamber that is used for etching features on a surface of the substrate. The cooling of the sorption structure is carried out by circulating a coolant from a coolant source through one or more channels of a coolant delivery network defined within a middle section of the sorption structure. The first temperature is defined to selectively adsorb gas species of interest, e.g. to be above a condensing temperature of one or more reactant gases used in the process chamber but is sufficiently cold to adsorb by-products generated in the chamber during processing of the substrate.

In operation 820, the by-products released within the chamber are captured using a lattice structure. The lattice structure is defined to be adjacent to a second side of the middle section. The lattice structure includes a network of openings defined in a plurality of layers, with each layer having a plurality of openings. The inner layer 114a of the lattice structure 114 is defined adjacent to the second side of the middle section and the outer layer 114b of the lattice structure 114 is facing an interior region of the process chamber. Openings in each layer of the lattice structure progressively increases in size from the inner layer 114a to the outer layer 114b, such that the outer layer provides a larger surface area for capturing the by-products. A vacuum line network coupled between the lattice structure and a pump provides the vacuum to create a low-pressure region in the lattice structure to adsorb the by-products. Along with the by-products some portion of the reactant gases may also be attracted to the low pressure region and removed through the vacuum line. However, the parameters of the system can be designed to minimize plasma reactant gas(es) leakage from the side walls. As more and more substrates are processed with the process chamber, there is an increase in the build-up of the by-products on the lattice structure. A pressure sensor disposed on the vacuum line between the lattice structure and the pump monitors the by-product build-up by measuring the pressure of the gases that are flowing via the vacuum line toward the pump. Initially, when the lattice structure is free of any by-product build-up, the reactant gases used in the chamber flows easily via the vacuum line to the pump. However, as the build-up of the by-products on the lattice structure increases, the openings in the different layers of the lattice structure become clogged with the by-products slowing the flow of the reactant gases in the vacuum line. Thus, when the pressure of the reactant gases in the vacuum line, as measured by the pressure sensor, falls below a predefined threshold level indicating that sufficient by-product build-up has been detected on the lattice structure, it is time to perform a cleaning operation of the lattice structure.

In operation 830, as part of the cleaning operation (i.e., desorption step), the sorption structure is heated to a second temperature using heating elements disposed in an inner layer of the sorption structure and the WAC/CWAC is performed. Along with the WAC/CWAC, GPAC may also be performed. The second temperature is defined based on the type of by-products released in the process chamber, the type of reactant gases used in the process chamber, amount of time the sorption structure has to be heated, etc. As the lattice structure is heated to the second temperature, the by-products get released from the surface of the lattice structure. The released by-products mix with the remnant gases in the process chamber.

In operation 840, the by-products with any remnant gases are removed from the process chamber through a primary vacuum line 113 defined between a bottom side surface of the process chamber and the pump. The cooling of the sorption structures and the capturing of the by-products are performed during the processing of substrate in the process chamber, while the operation of heating and removing of the by-products are performed when no substrates are being processed in the chamber. As a result, during the cleaning operation, the local low pressure is shut off by turning off the vacuum applied through the vacuum line. The by-products released from the lattice structure are removed through the primary vacuum line 113.

The various implementations discussed herein provide a sorption structure design that can be implemented in portions of the chamber wall to efficiently remove the by-products from the process chamber in a controllable, repeatable and consistent manner without requiring the process chamber to be opened to ambient environment, while extending the time the chamber can process wafers without the need for cleaning. The lattice structure defined in the sorption structure design provides a large surface area. In some implementations, the entire sorption structure is made of a conductive material. The conductive property of the material allows the sorption structure to provide a cold surface during adsorption operation by flowing a coolant there-through and provide a hot surface during desorption by heating via embedded heating elements during WAC or GPAC. In some implementations, the coolant that may be used to cool the sorption structure may be liquid Nitrogen. In alternate implementations, the coolant could be any other type of coolants. Valves and/or other flow controls are provided on a vacuum line that is disposed between the sorption structure and a sorption pump to control the low pressure region on the sorption structure. The lattice structure can be engineered to have specific surface roughness to provide a good adhesion quality between the by-products and the lattice structure so that the by-products can successfully adhere to the lattice structure. The topology of the lattice unit cells in the different layers of the lattice structure ensures that the by-products are distributed across the surface of the lattice structure and are not concentrating in a single spot. Additionally, the size of the openings also helps in defining a good pressure gradient from the outer layer to the inner layer of the lattice structure. For example, if the pressure of the plasma defined in the process chamber is about 40 mTorr, then the pressure gradient defined by the lattice structure can range from 40 mTorr at the outer layer facing the interior region of the process chamber to about 20 mTorr at the inner layer. Similar pressure gradient may be envisioned when a different pressure of plasma is used inside the process chamber. One skilled in the art will be able to identify other advantages and benefits of the sorption structure defined in a portion of the chamber wall of the process chamber.

Figure 9:
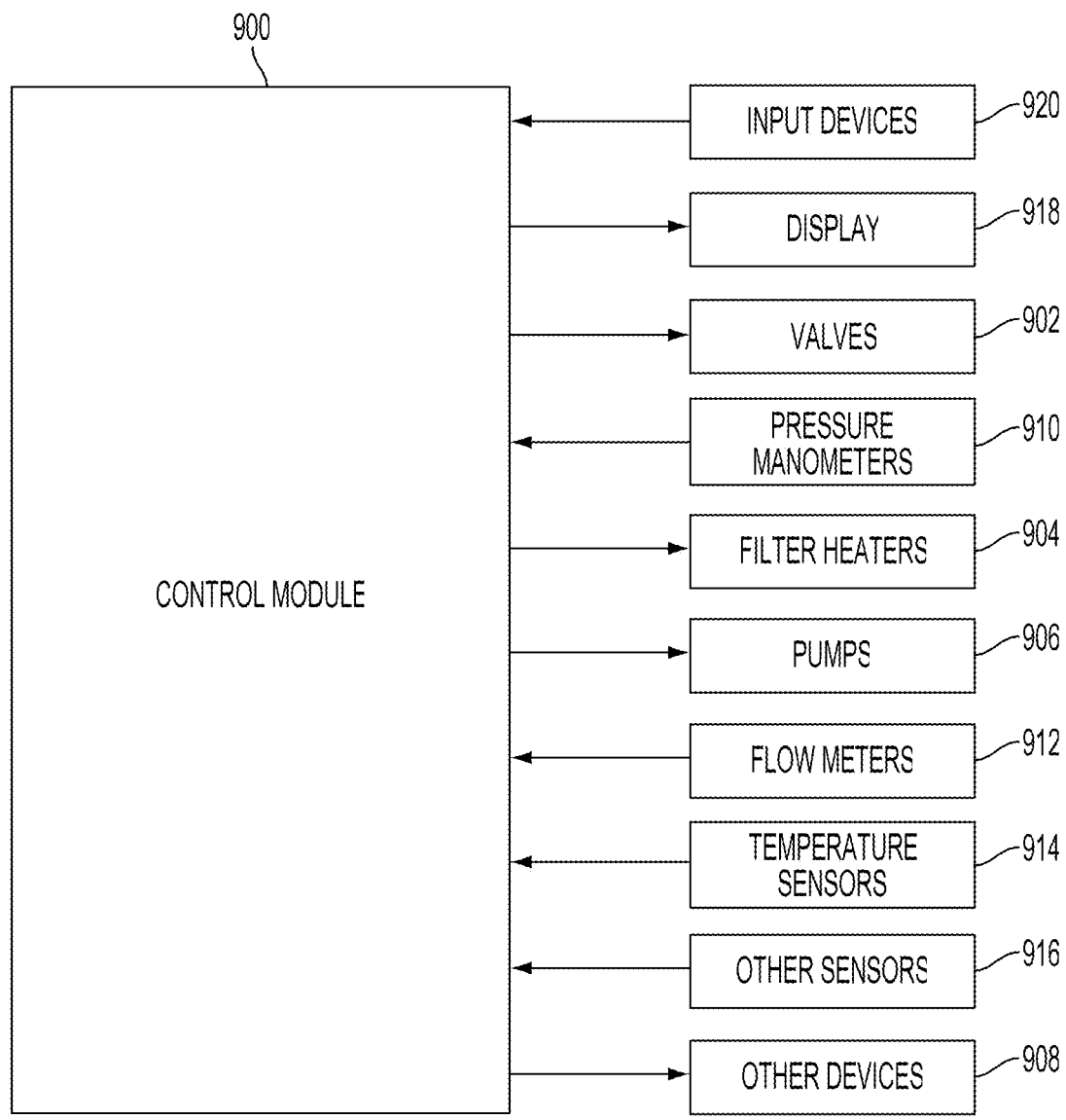
FIG. 9 illustrates a control module (i.e., a controller) for controlling various process parameters of a cluster tool including temperatures and other parameters for controlling operation of the sorption structure, in accordance with one implementation.

FIG. 9 shows a control module (also referred to as a "controller") 900 for controlling the substrate processing system described above. In one embodiment, the controller 900 may include some example components, such as a processor, memory and one or more interfaces. The controller 900 may be employed to control various components and/or devices in a substrate process chamber 100 based in part on sensed values. For example only, the controller 900 may control one or more of valves 902 (including valves 132 of FIGS. 1, 3, 6A, 6B), filter heaters 904 (including heating elements 115), pumps 906 (including pump 107), and other devices 908 based on the sensed values and other control parameters. The controller 900 receives the sensed values from, for example only, pressure manometers 910, flow meters 912, temperature sensors 914, pressure sensors 131 (not shown) and/or other sensors 916. The controller 900 may also be employed to control process conditions during precursor delivery, reactant gas(es) delivery, deposition of a film and etch of a feature. The controller 900 will typically include one or more memory devices and one or more processors.

The controller 900 may control activities of the precursor delivery system and deposition apparatus. The controller 900 executes computer programs including sets of instructions for controlling process timing, delivery system temperature, pressure differentials across the filters, valve positions, robots and end effectors, mixture of gases, chamber pressure, chamber temperature, wafer temperature, RF power levels, wafer chuck or pedestal position, and other parameters of a particular process. The controller 900 may also monitor the pressure differential and automatically switch vapor precursor delivery from one or more paths to one or more other paths. Additionally, the controller 900 may monitor the pressure along the vacuum line 108 using the pressure sensor 131 and generate a signal to perform a desorption step to clean the by-products that have adhered to the lattice structure 114 of the sorption structure 110. Other computer programs stored on memory devices associated with the controller 900 may be employed in some embodiments.

Typically there will be a user interface associated with the controller 900. The user interface may include a display 918 (e.g. a display screen and/or graphical software displays of the apparatus and/or process conditions), and user input devices 920 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module (i.e., controller) parameters relate to process conditions such as, for example, filter pressure differentials, process gas composition and flow rates, temperature, pressure, plasma conditions such as RF power levels and the low frequency RF frequency, cooling gas pressure, and chamber wall temperature. The control module parameters may also include primary operational parameters that influence the design parameters.

The system software may be designed or configured in many different ways. For example, various chamber component subroutines or control objects may be written to control operation of the chamber or process module components necessary to carry out the inventive deposition processes. Examples of programs or sections of programs for this purpose include substrate positioning code, process gas control code, pressure control code, heating element control code, plasma control code, lift mechanism control code, robot position code, end effector position code and valve position control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. The pressure control program may also include code for controlling the pressure in the vacuum line by regulating a valve (e.g., throttle valve) 132 along the vacuum line. A heating element control program may include code for controlling the current to heating units for heating components in the precursor delivery system, the substrate, the sorption structure, and/or other portions of the system. Alternatively, the heating element control program may control delivery of a heat transfer gas such as helium to the wafer chuck. The valve position control code may include code to control access to a process module or the substrate processing system by controlling isolation valves that provide access to the process module or the cluster tool, for example. The lift mechanism control code may include code to activate the actuator drive to cause the actuators to move the lift pins, for example. The robot position code may include code to manipulate the position of the robot(s) including manipulation of the robot to move along a lateral, a vertical, or a radial axis, for example. The end effector position code may include code to manipulate the position of the end effector including manipulation of the robot to extend, contract, or move along a lateral, a vertical or radial axis, for example.

Examples of sensors that may be monitored during deposition include, but are not limited to, mass flow control modules, pressure sensors such as the pressure manometers 910, pressure sensor 131, and thermocouples located in delivery system, the pedestal or chuck (e.g. the temperature sensors 914). Appropriately programmed feedback and control algorithms may be used with data from these sensors to maintain desired process conditions. The foregoing describes implementation of embodiments of the invention in a single or multi-chamber semiconductor processing tool.

The various embodiments described herein allow the consumable parts to be replaced in a fast and efficient manner without having to open the substrate processing system to atmospheric conditions. As a result, the time to replace consumable parts, as well as any risk of contaminating the chamber during replacement of consumable parts is greatly reduced, thereby allowing the substrate processing system to come online faster. Further, risk of inadvertent damage to the process module, the consumable part and to other hardware components in the process module are greatly reduced.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A sorption structure integrated into a portion of a chamber used for processing a substrate, the sorption structure comprising:
   an inner section having one or more heating elements;
   a middle section having a coolant delivery network to receive and circulate a coolant from a coolant source and a plurality of vacuum conduits connected to a vacuum line, wherein the middle section is disposed adjacent to the inner section;
   a lattice structure having an inner layer defined adjacent to the middle section and an outer layer defined adjacent to the inner layer and configured to face an interior region of the chamber, wherein the inner layer and the outer layer include a network of openings, and wherein the plurality of vacuum conduits are configured to connect to the lattice structure via the inner layer,
   wherein the vacuum line and the plurality of vacuum conduits are configured to be used during processing to create a low pressure region in the lattice structure relative to a pressure in the chamber to adsorb by-products released in the chamber during the processing of the substrate.

2. The sorption structure of claim 1, wherein the vacuum line is connected to a pump.

3. The sorption structure of claim 1, wherein the coolant delivery network includes a coolant inlet to receive the coolant from the coolant source, a coolant outlet and one or more channels defined between the coolant inlet and the coolant outlet to allow the coolant to flow.

4. The sorption structure of claim 1, wherein the coolant delivery network is configured to maintain the lattice structure at a first temperature during processing.

5. The sorption structure of claim 1, wherein the sorption structure is configured to be integrated into a portion of a wall of the chamber that aligns with a gap defined between an upper electrode and a lower electrode disposed in the chamber.

6. The sorption structure of claim 1, wherein the sorption structure is configured to be integrated into a portion of a plasma confinement structure defined in the chamber, the portion of the plasma confinement structure aligns with a gap defined between an upper electrode and a lower electrode disposed in the chamber.

7. The sorption structure of claim 1, wherein the sorption structure is integrated into a portion of an inner liner defined in the chamber, the portion of the inner liner aligns with a gap defined between an upper electrode and a lower electrode disposed in the chamber.

8. The sorption structure of claim 1, wherein a size of the openings in the inner layer is different from a size of the openings in the outer layer.

9. The sorption structure of claim 8, wherein the size of the openings within the network of openings progressively increases from the inner layer to the outer layer.

10. The sorption structure of claim 1, wherein a size of the openings is based on a size of a gap defined between an upper electrode and a lower electrode disposed in the chamber.

11. The sorption structure of claim 1, wherein a size of the openings is based on at least one of a type of reactant gas to be used in the chamber and a type of by-products expected to be present in the chamber.

12. The sorption structure of claim 1, wherein the plurality of vacuum conduits are configured to connect to a gas source to apply high-pressure gas from the gas source to the inner layer of the lattice structure to assist in releasing the by-products, the high-pressure gas is received during a desorption operation for removing the by-products from the chamber.

13. The sorption structure of claim 1, wherein the vacuum line further includes a pressure sensor disposed between the lattice structure and a pump, the pressure sensor used to monitor pressure of the by-products and any reactant gas flowing out of the chamber via the vacuum line.

14. The sorption structure of claim 1, wherein the sorption structure is a single, continuous piece that is configured to fit in the portion of the chamber, the portion of the chamber including conduits to route one or more inputs and outputs of the sorption structure.

15. The sorption structure of claim 1, wherein the sorption structure is a sectional piece that covers a sub-portion of the portion of the chamber, the portion of the chamber including a plurality of the sectional pieces distributed along a circumference of the portion of the chamber, the portion of the chamber includes conduits to route inputs and outputs of the plurality of sectional pieces of the sorption structure.

16. The sorption structure of claim 15, wherein each sectional piece of the plurality of sectional pieces is separated from an adjacent sectional piece by an angle of separation.

17. The sorption structure of claim 16, wherein the angle of separation is between about 5° to about 10°.

18. The sorption structure of claim 15, wherein the inputs and outputs of the plurality of sectional pieces is routed through a single conduit defined in a back side of the portion of the chamber and through channels defined in a wall of the chamber or through a lower electrode defined in the chamber.

19. The sorption structure of claim 1, wherein the one or more heating elements in the inner section are engaged during a desorption step and are configured to heat the sorption structure to a second temperature to release the by-products adsorbed on the lattice structure.

20. A method for removing by-products using a sorption structure integrated in a portion of a chamber used for processing a substrate, the method comprising:
cooling the sorption structure to a first temperature by circulating a coolant from a coolant source through one or more channels of a coolant delivery network defined within a middle section of the sorption structure;
using a plurality of vacuum conduits defined in the middle section to create a low pressure region in a lattice structure defined adjacent to the middle section, the plurality of vacuum conduits being coupled to a vacuum line, wherein an outer layer of the lattice structure is exposed to an interior region of the chamber, the low pressure region causes the by-products present within the chamber to be adsorbed in a plurality of openings of the lattice structure;
heating the sorption structure to a second temperature using one or more heating elements defined in an inner section of the sorption structure, to release the by-products that have adsorbed in the plurality of openings of the lattice structure, wherein the middle section is disposed between the inner section and the lattice structure; and
removing the by-products released from the lattice structure through the plurality of vacuum conduits coupled to the vacuum line.

21. The method of claim 20, wherein the vacuum line is coupled to a pump.

22. The method of claim 21, further comprising:
monitoring pressure of the by-products flowing through the vacuum line; and
when the pressure of the by-products is below a pre-defined threshold point, initiating the heating of the sorption structure to remove the by-products adsorbed in the plurality of openings.

23. The method of claim 20, wherein the first temperature is defined to be sufficient to condense the by-products present in the chamber.

24. The method of claim 20, wherein the cooling and using the plurality of vacuum conduits to create the low pressure region are performed during processing of the substrate, and wherein the heating and the removing of the by-products are performed with waferless auto clean (WAC) when no substrate is present in the chamber.

25. The method of claim 20, further includes,
applying a gas to an inner layer of the lattice structure through the vacuum line and the plurality of vacuum conduits, the gas being applied from a gas source coupled to the vacuum line at a defined pressure, so as to create a force that is sufficient to release the by-products adsorbed on the lattice structure; and
removing the by-products released from the lattice structure through a primary vacuum line defined in the chamber.

26. The method of claim 25, wherein the primary vacuum line is different from the vacuum line that is coupled to the plurality of vacuum conduits.

27. The method of claim 25, wherein the gas is Nitrogen.

* * * * *